(12) United States Patent
Hwang et al.

(10) Patent No.: US 11,404,395 B2
(45) Date of Patent: Aug. 2, 2022

(54) SEMICONDUCTOR PACKAGE INCLUDING UNDERFILL MATERIAL LAYER AND METHOD OF FORMING THE SAME

(71) Applicant: SAMSUNG ELECTRONICS CO., LTD., Suwon-si (KR)

(72) Inventors: Jihwan Hwang, Hwaseong-si (KR); Taehun Kim, Asan-si (KR); Jihwan Suh, Suwon-si (KR); Soyoun Lee, Hwaseong-si (KR); Hyuekjae Lee, Hwaseong-si (KR); Jiseok Hong, Yongin-si (KR)

(73) Assignee: SAMSUNG ELECTRONICS CO., LTD.

( * ) Notice: Subject to any disclaimer, the term of this patent is extended or adjusted under 35 U.S.C. 154(b) by 50 days.

(21) Appl. No.: 17/036,508

(22) Filed: Sep. 29, 2020

(65) Prior Publication Data

US 2021/0151410 A1    May 20, 2021

(30) Foreign Application Priority Data

Nov. 15, 2019 (KR) .................. 10-2019-0147081

(51) Int. Cl.
*H01L 25/065* (2006.01)
*H01L 25/00* (2006.01)

(52) U.S. Cl.
CPC .......... *H01L 25/0657* (2013.01); *H01L 25/50* (2013.01); *H01L 2225/06513* (2013.01); *H01L 2225/06541* (2013.01); *H01L 2225/06586* (2013.01); *H01L 2225/06589* (2013.01)

(58) Field of Classification Search
CPC .............. H01L 25/0657; H01L 25/50; H01L 2225/06513; H01L 2225/06541; H01L 2225/06586; H01L 2225/06589; H01L 23/3128; H01L 23/36; H01L 23/3135; H01L 25/03; H01L 25/18; H01L 23/31; H01L 21/563; H01L 23/29; H01L 23/49816

See application file for complete search history.

(56) References Cited

U.S. PATENT DOCUMENTS

| 8,518,741 B1 | 8/2013 | Lu et al. |
| 8,759,963 B2 | 6/2014 | Nah et al. |
| 9,123,830 B2 | 9/2015 | Nakamura et al. |
| 9,343,432 B2 * | 5/2016 | Lee ..................... H01L 23/3128 |

(Continued)

FOREIGN PATENT DOCUMENTS

JP    2004311709 A    11/2004

*Primary Examiner* — Mamadou L Diallo
(74) *Attorney, Agent, or Firm* — Myers Bigel, P.A.

(57) ABSTRACT

A semiconductor package and a method of forming the same are provided. The semiconductor package includes one or a plurality of chips on a substrate, bumps disposed below each of the one or plurality of chips, an underfill material layer on the substrate, on a side surface of each of the bumps, and extending to side surfaces of the one or plurality of chips, and a mold layer on the substrate and contacting the underfill material layer. The underfill material layer includes a first side portion, a second side portion on the first side portion and having a slope, steeper than a slope of the first side portion, and a third side portion on the second side portion and having a slope that is less steep than a slope of the second side portion.

18 Claims, 29 Drawing Sheets

(56) References Cited

U.S. PATENT DOCUMENTS

| | | | |
|---|---|---|---|
| 9,508,704 B2 | 11/2016 | Chung et al. | |
| 9,966,278 B1 | 5/2018 | Kim et al. | |
| 10,153,255 B2 | 12/2018 | Hwang et al. | |
| 10,804,178 B2 * | 10/2020 | Yu | H01L 24/32 |
| 11,145,623 B2 * | 10/2021 | Hsu | H01L 24/08 |
| 2009/0140381 A1 | 6/2009 | Lin et al. | |
| 2012/0077312 A1 | 3/2012 | Lee et al. | |
| 2013/0175706 A1 * | 7/2013 | Choi | H01L 25/0657 |
| | | | 257/777 |
| 2014/0091460 A1 * | 4/2014 | Lee | H01L 25/50 |
| | | | 257/737 |
| 2015/0162265 A1 * | 6/2015 | Jo | H01L 25/50 |
| | | | 257/774 |
| 2016/0013115 A1 * | 1/2016 | Vadhavkar | H01L 21/50 |
| | | | 257/713 |
| 2017/0243857 A1 * | 8/2017 | Hwang | H01L 25/105 |
| 2018/0286835 A1 | 10/2018 | Nah | |
| 2019/0067157 A1 | 2/2019 | Lin | |
| 2021/0035859 A1 * | 2/2021 | Mehta | H01L 23/373 |

* cited by examiner

SEMICONDUCTOR PACKAGE INCLUDING UNDERFILL MATERIAL LAYER AND METHOD OF FORMING THE SAME

CROSS-REFERENCE TO RELATED APPLICATION(S)

This application claims benefit of priority to Korean Patent Application No. 10-2019-0147081 filed on Nov. 15, 2019 in the Korean Intellectual Property Office, the disclosure of which is incorporated herein by reference in its entirety.

BACKGROUND

The present inventive concept relates to a semiconductor package, and more particularly, to a semiconductor package including an underfill material layer, and a method of forming the same.

In general, in order to mount a semiconductor chip to which solder balls are attached on a printed circuit board, the solder balls may be reflowed while applying pressure to the semiconductor chip under a temperature atmosphere in which the solder balls may be reflowed, to attach the semiconductor chip to the printed circuit board. Therefore, the semiconductor chip may be attached to the printed circuit board by the reflowed solder balls. Recently, as a thickness of the semiconductor chip has gradually been reduced, problems such as warpage of the semiconductor chip or the like have been generated at a temperature for reflowing the solder balls.

SUMMARY

Some embodiments of the present inventive concept provide a semiconductor package having relatively high reliability.

An object of the present inventive concept is to provide a semiconductor package, capable of mass production, and a method of forming the same.

According to some embodiments of the present inventive concept, a semiconductor package includes a plurality of stacked chips on a substrate and spaced apart from each other in a vertical direction, the plurality of stacked chips including a lower chip and an upper chip, and the vertical direction is a direction substantially perpendicular to an upper surface of the substrate; lower bumps between the lower chip and the substrate, interlayer bumps between adjacent chips, among the plurality of stacked chips, a mold layer on the substrate, and an underfill material layer on the substrate. The underfill material layer includes a lower portion, an interlayer portion, and a side portion. The lower portion is on a side surface of each of the lower bumps and is in a space between the lower chip and the substrate, the interlayer portion is on a side surface of each of the interlayer bumps and is in a space between adjacent chips, among the plurality of stacked chips, the side portion extends from the lower portion and the interlayer portion and is adjacent side surfaces of the plurality of stacked chips, the side portion includes a first side portion, and a second side portion, on the first side portion. A slope of the second side portion is steeper than a slope of the first side portion. The second side portion overlaps at least two chips adjacent to each other, among the plurality of stacked chips, in a horizontal direction. The horizontal direction is a direction substantially parallel to the upper surface of the substrate. At least a portion of the mold layer is on the side portion of the underfill material layer.

According to some embodiments of the present inventive concept, a semiconductor package includes one or a plurality of chips on a substrate, bumps below each of the one or plurality of chips, and an underfill material layer on the substrate, on a side surface of each of the bumps, and extending onto a side surface of each of the one or plurality of chips. The underfill material layer includes a first side portion, a second side portion on the first side portion, and a third side portion on the second side portion. slope of the second side portion is steeper than a slope of the first side portion. A slope of the third side portion is less steep than the slope of the second side portion.

According to some embodiments of the present inventive concept, a semiconductor package includes a plurality of chips stacked on a substrate in a direction perpendicular to an upper surface of the substrate, bumps below ones of the plurality of chips, and an underfill material layer on the substrate, on a side surface of each of the bumps, and extending onto a side surface of each of the plurality of chips. The underfill material layer includes a portion having a constant slope or a constantly varying slope. At least two chips adjacent to each other, among the plurality of chips, overlap the portion of the underfill material layer having a constant slope or a constantly varying slope in a horizontal direction. The horizontal direction is parallel to the upper surface of the substrate.

According to some embodiments of the present inventive concept, a method of forming a semiconductor package includes preparing a plurality of chips to which solder balls and a non-conductive film are attached, the non-conductive film on at least a side surface of each of the solder balls, preparing a preliminary substrate, pressing the plurality of chips to which the solder balls and the non-conductive film that are attached onto the preliminary substrate. As the plurality of chips are pressed, thicknesses of the solder balls are reduced to form preliminary chip bumps, and, as the plurality of chips are pressed, a thickness of the non-conductive film is reduced to protrude toward side surfaces of the plurality of chips. The method includes loading the attached preliminary substrate, the preliminary substrate onto which the plurality of chips to which the solder balls and the non-conductive film are attached, into a process chamber, performing a solder reflow process and an underfill material reflow process in the process chamber to reflow the preliminary chip bumps and the non-conductive film on the preliminary substrate, to form the preliminary chip bumps as reflowed chip bumps and form the non-conductive film as an underfill material layer that was reflowed, unloading the chip from the process chamber. The chip is attached to the preliminary substrate, by the reflowed chip bumps and the underfill material layer. The method includes forming a mold layer, on the underfill material layer, at least a portion of the preliminary substrate, and cutting the preliminary substrate while cutting the mold layer around the chip.

According to some embodiments of the present inventive concept, a semiconductor package includes a plurality of chips stacked on a substrate, an underfill material layer on the substrate and extending onto a side surface of each of the plurality of chips, and a mold layer on the substrate and in contact with the underfill material layer. The mold layer is in contact with a side surface of an upper chip of the plurality of chips. The underfill material layer includes a first side portion, a second side portion on the first side portion, and a third side portion on the second side portion. A slope of the second side portion is steeper than a slope of the first side portion. A slope of the third side portion is less steep than the slope of the second side portion.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
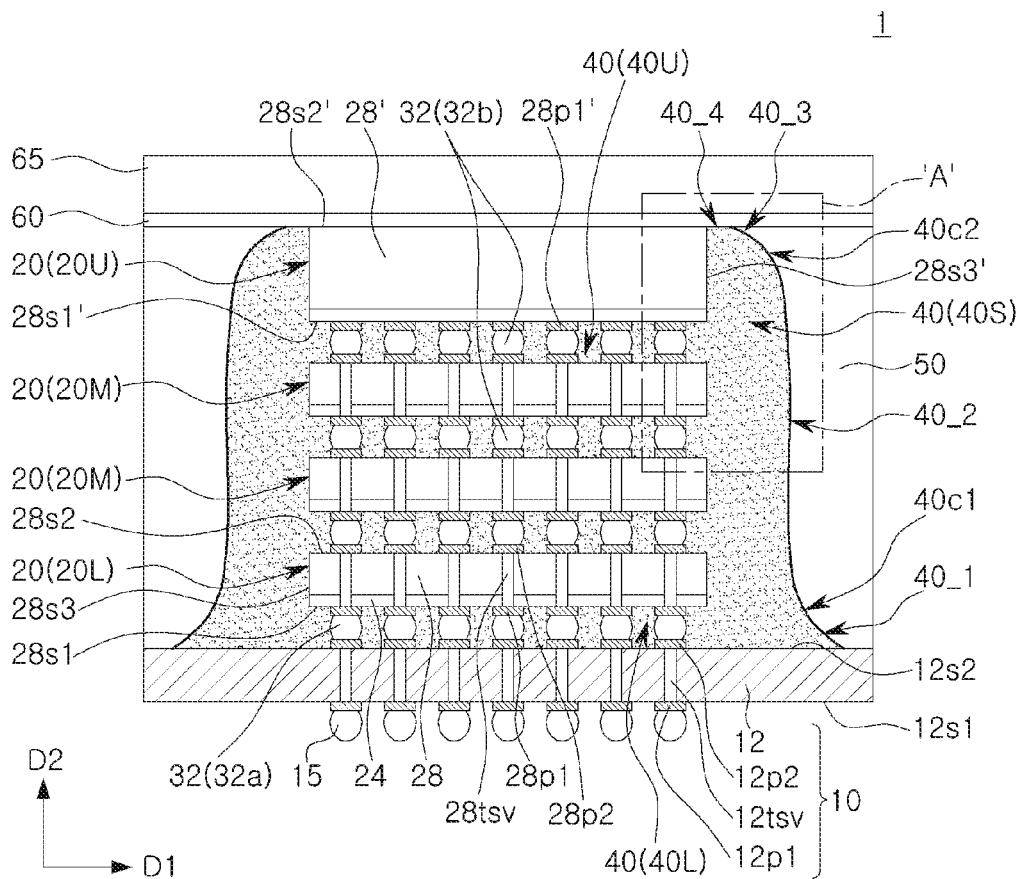
FIG. 1 is a cross-sectional view illustrating a semiconductor package according to some embodiments of the present inventive concept.

First, an example of a semiconductor package according to some embodiments of the present inventive concept will be illustrated in FIG. 1. FIG. 1 is a cross-sectional view illustrating a semiconductor package according to some embodiments of the present inventive concept.

Referring to FIG. 1, a semiconductor package 1 according to some embodiments may include a substrate 10, a plurality of stacked chips 20 disposed on the substrate 10 and spaced apart from each other in a vertical direction (D2), chip bumps 32, a mold layer 50 disposed on the substrate 10, and an underfill material layer 40 disposed on the substrate 10.

In some embodiments, the substrate 10 may include a substrate base 12 having a first surface 12s1 and a second surface 12s2 opposing each other, first substrate pads 12p1 disposed on the first surface 12s1 of the substrate base 12, second substrate pads 12p2 disposed on the second surface 12s2 of the substrate base 12, and internal electrodes 12tsv formed in the substrate base 12 and electrically connecting the first substrate pads 12p1 and the second substrate pads 12p2. The internal electrodes 12tsv may be through electrodes or internal wirings.

In some embodiments, the semiconductor package 1 may further include substrate bumps 15 disposed below the substrate 10 and contacting the first substrate pads 12p1. The substrate bumps 15 may be solder bumps.

The first surface 12s1 of the substrate base 12 may be referred to as a lower surface of the substrate 10, and the second surface 12s2 of the substrate base 12 may be referred to as an upper surface of the substrate 10. The vertical direction (D2) may be a direction perpendicular to the upper surface 12s2 of the substrate 10.

In some embodiments, the substrate 10 may be a printed circuit board, an interposer, or a semiconductor chip (e.g., a logic semiconductor chip).

In some embodiments, each of the plurality of stacked chips 20 may be a semiconductor chip. For example, the plurality of stacked chips 20 may be memory semiconductor chips.

The number of the plurality of stacked chips 20 are not limited to the number thereof, illustrated in the drawings. For example, the plurality of stacked chips 20 may include two stacked chips, or a plurality of stacked chips, or more than the four stacked chips illustrated in the drawings.

In some embodiments, the plurality of stacked chips 20 may be the same semiconductor chips. For example, the plurality of stacked chips 20 may be a memory semiconductor chip such as a dynamic random access memory (DRAM), or a memory semiconductor chip such as a NAND flash. Types of semiconductor chips of the plurality of stacked chips 20 are not limited to the DRAM or the NAND flash, described above. For example, the plurality of stacked chips 20 may be a phase-change random access memory (PRAM), a resistive random access memory (ReRAM), or a magneto-resistive random access memory (MRAM).

In some embodiments, the plurality of stacked chips 20 may include different kinds of semiconductor chips. For example, one of the plurality of stacked chips 20 may be a logic semiconductor chip or a processor chip, and one or a plurality of remaining chips may be a memory semiconductor chip. For example, the plurality of stacked chips 20 may include a lower chip which may be a logic semiconductor chip or a process chip, and/or a memory semiconductor chip in which one or a plurality of chips are disposed on the lower chip.

The plurality of stacked chips 20 may include a lower chip 20L and an upper chip 20U. The plurality of stacked chips 20 may further include one or a plurality of intermediate chips 20M between the lower chip 20L and the upper chip 20U. Each of the lower chip 20L and the one or plurality of intermediate chips 20M may include a lower chip base 28 having a first surface 28s1 and a second surface 28s2 opposing each other, first chip pads 28p1 disposed on the first surface 28s1 of the lower chip base 28, second chip pads 28p2 disposed on the second surface 28s2 of the lower chip base 28, and a plurality of through electrode structures 28tsv electrically connecting the first chip pads 28p1 and the second chip pads 28p2. In each of the lower chip 20L and the one or plurality of intermediate chips 20M, the first surface 28s1 of the lower chip base 28 may be located in a direction facing the substrate 10.

The upper chip 20U may include an upper chip base 28' having a first surface 28s1' and a second surface 28s2' opposing each other, and/or lower chip pads 28p1' on the first surface 28s1' of the upper chip base 28'. In the upper chip 20U, the first surface 28s1' of the upper chip base 28' may be located in a direction facing the substrate 10.

Each of the plurality of stacked chips 20 may include an internal circuit region 24 disposed on the surfaces 28s1 and 28s1' facing the substrate 10.

The chip bumps 32 may include lower bumps 32a which may be disposed between the lower chip 20L and the substrate 10, and interlayer bumps 32b which may be disposed between chips adjacent to each other, among the plurality of stacked chips 20. The chip bumps 32 may be solder bumps. A side surface of each of the chip bumps 32 may be convex.

The lower bumps 32a may contact the first chip pads 28p1 of the lower chip 20L and the second substrate pads 12p2 of the substrate 10.

The interlayer bumps 32b may electrically connect chips adjacent to each other, among the plurality of stacked chips 20. For example, the interlayer bumps 32b may be in contact with the second chip pads 28p2 of the chip, located relatively below, and the first chip pads 28p1 of the chip, located relatively above, in a vertical direction.

The underfill material layer 40 may include a lower portion 40L, an interlayer portion 40U, and a side portion 40S.

The lower portion 40L of the underfill material layer 40 may surround a side surface of each of the lower bumps 32a, and may fill a space between the lower chip 20L and the substrate 10.

The interlayer portion 40U of the underfill material layer 40 may surround a side surface of each of the interlayer bumps 32b, and may fill a space between adjacent chips among the plurality of stacked chips 20.

The side portion 40S of the underfill material layer 40 may extend from the lower portion 40L and the interlayer portion 40U, and may cover side surfaces 28s3 and 28s3' of the plurality of stacked chips 20. The underfill material layer 40 may extend continuously from the lower portion 40L and the interlayer portion 40U to the side portion 40S without any boundary. Therefore, the underfill material layer 40 may be integrally formed without any interface.

The side portion 40S of the underfill material layer 40 may include a first side portion 40_1, and a second side portion 40_2 disposed on the first side portion 40_1 and having a slope, steeper than a slope of the first side portion 40_1. The first side portion 40_1 may be adjacent to the substrate 10.

In some embodiments, the second side portion 40_2 may have a substantially constant slope or a substantially constant varying slope.

In some embodiments, at least two chips adjacent to each other, among the plurality of stacked chips 20, may overlap the second side portion 40_2 in a horizontal direction (D1). The horizontal direction (D1) may be a direction parallel to the upper surface 12s2 of the substrate 10.

The side portion 40S of the underfill material layer 40 may further include a third side portion 40_3 disposed on the second side portion 40_2 and having a slope, gentler or less steep than the slope of the second side portion 40_2.

The side portion 40S of the underfill material layer 40 may further include a first curved portion 40c1 disposed between the first side portion 40_1 and the second side portion 40_2, and a second curved portion 40c2 disposed between the second side portion 40_2 and the third side portion 40_3. In the side portion 40S of the underfill material layer 40, the first curved portion 40c1 may be concave, and the second curved portion 40c2 may be convex.

The first curved portion 40c1 may be referred to as a lower curved portion, and the second curved portion 40c2 may be referred to as an upper curved portion.

An upper surface 40_4 of the underfill material layer 40 may be planar.

The side portion 40S of the underfill material layer 40 may entirely cover or overlap the side surfaces 28s3 and 28s3' of the plurality of stacked chips 20.

The underfill material layer 40 may include an epoxy resin and/or a filler.

The mold layer 50 may surround the side portion 40S of the underfill finish layer 40. The mold layer 50 may cover or overlap the side portion 40S of the underfill material layer 40. The mold layer 50 may be in contact with the side portion 40S of the underfill material layer 40. The mold layer 50 may be formed of an epoxy mold compound (EMC) including a filler.

The semiconductor package 1 according to an embodiment may further include a heat transfer material layer 60 (including a thermal interface material), and a heat dissipation member 65 on the heat transfer material layer 60. The heat transfer material layer 60 may be formed of a material that may maintain electrical insulation properties. The heat dissipation member 65 may be a heat sink, a heat spreader, or a heat pipe.

Figure 2:
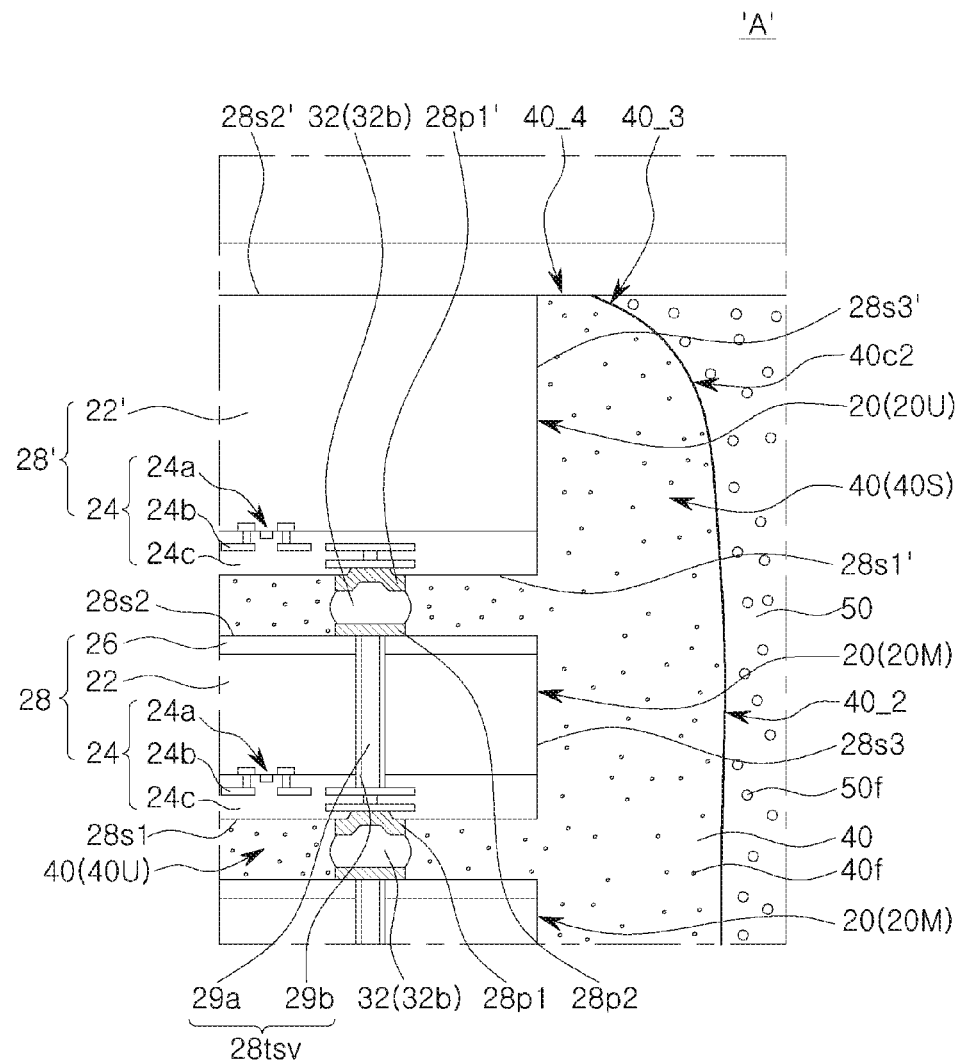
FIG. 2 is a partially enlarged cross-sectional view illustrating a portion of a semiconductor package according to some embodiments of the present inventive concept.

Next, an example of the plurality of stacked chips 20, an example of the underfill material layer 40, and an example of the mold layer 50 will be illustrated in FIG. 2. FIG. 2 is an enlarged view of portion 'A' of FIG. 1. Since the lower chip (20L of FIG. 1) may have the same cross-sectional structure as the one or plurality of intermediate chips 20M, the lower chip (20L of FIG. 1) is not disclosed in FIG. 2, but the cross-sectional structure of the lower chip (20L of FIG. 1) may be easily understood from the cross-sectional structure of the one or plurality of intermediate chips 20M illustrated in FIG. 2. Therefore, the cross-sectional structure of the lower chip illustrated in FIG. 1 (20L of FIG. 1) may be understood to be the same as or similar to the cross-sectional structure of the one or plurality of intermediate chips 20M of FIG. 2.

Referring to FIGS. 1 and 2, in each of the plurality of stacked chips 20, the internal circuit region 24 may include individual elements 24a, wirings 24b electrically connected to the individual elements 24a, and a front surface insulating layer 24c covering the individual elements 24a and the wirings 24b. The individual elements 24a may include active elements such as transistors, passive elements such as resistors or capacitors, or the like.

In each of the lower chip (20L of FIG. 1) and the one or plurality of intermediate chips 20M, the lower chip base 28 may include a first semiconductor substrate 22, the internal circuit region 24 below the first semiconductor substrate 22, and a rear surface insulating layer 26 on the first semiconductor substrate 22.

In each of the lower chip (20L of FIG. 1) and the one or plurality of intermediate chips 20M, the second chip pads 28p2 may be disposed on the rear surface insulating layer 26, and the first chip pads 28p1 may be disposed on the front surface insulating layer 24c.

In the upper chip 20U, the upper chip base 28' may include a second semiconductor substrate 22', and an internal circuit region 24 below the second semiconductor substrate 22'.

Each of the through electrode structures 28tsv may include a through electrode 29a passing through the first semiconductor substrate 22, and an insulating spacer 29b surrounding a side surface of the through electrode 29a. The insulating spacer 29b may electrically insulate the through electrode 29a from the first semiconductor substrate 22.

In some embodiments, the underfill material layer 40 may be formed of an epoxy resin including a first filler 40*f*. The first filler 40*f* may be in a powder form such as silica, silicon carbide, aluminum nitride, or the like.

In some embodiments, the underfill material layer 40 may be formed of an EMC including a second filler 50*f*. A size of the second filler 50*f* may be larger than a size of the first filler 40*f*. A diameter of the second filler 50*f* may be larger than a diameter of the first filler 40*f*.

Figure 3:
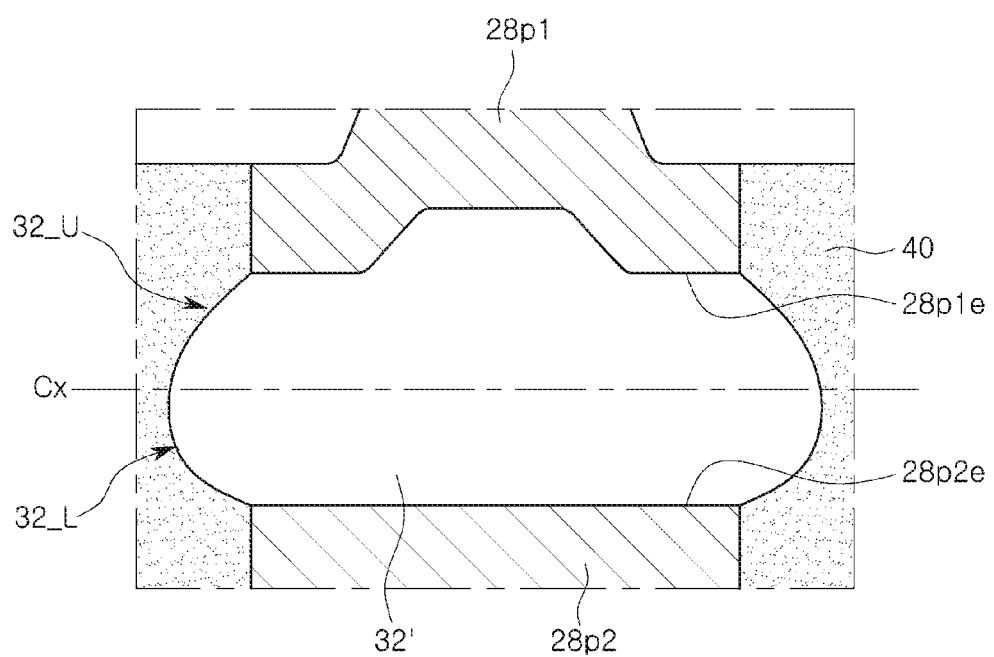
FIG. 3 is a partially enlarged cross-sectional view illustrating a modified example of a semiconductor package according to some embodiments of the present inventive concept.

In some embodiments, each of the chip bumps 32 may have a side surface of a symmetrical structure. For example, each of the chip bumps 32 may have a side surface of a vertically symmetrical structure between the first chip pad 28*p*1 and the second chip pad 28*p*2 opposing each other. The technical concept of the present inventive concept is not limited thereto. For example, at least a portion of the chip bumps 32 may be modified to have an asymmetrical structure. An example of a chip bump including a lower portion 32_L and an upper portion 32_U of the asymmetric structure will be illustrated in FIG. 3. FIG. 3 is a partially enlarged cross-sectional view illustrating a chip bump 32'.

In a modified example, referring to FIG. 3, a chip bump 32' may include a lower portion 32_L and an upper portion 32_U having an asymmetrical structure. For example, between a first chip pad 28*p*1 and a second chip pad 28*p*2 opposing each other, the chip bump 32' may include the lower portion 32_L and the upper portion 32_U, which may be defined based on a central axis (Cx) between the first chip pad 28*p*1 and the second chip pad 28*p*2.

The central axis (Cx) may be a virtual axis passing through a center between a lower end surface 28*p*1*e* of the first chip pad 28*p*1 and an upper end surface 28*p*2*e* of the second chip pad 28*p*2.

In the chip bump 32', the lower portion 32_L may be defined as a portion located below the central axis (Cx), and the upper portion 32_U may be defined as a portion located on the central axis (Cx). The maximum width of the lower portion 32_L may be greater than a maximum width of the upper portion 32_U.

The side surface of the chip bump 32' may be convex. In the chip bump 32', a curvature radius of at least a portion of the lower portion 32_L may be smaller than a curvature radius of the upper portion 30_U. For example, the most convex portion of the chip bump 32' in a horizontal direction, for example, in a direction, parallel to the upper end surface 28*p*2*e* of the second chip pad 28*p*2, may be located in the lower portion 32_L. Therefore, the lower portion 32_L may laterally protrude, relative to the upper portion 30_U. Therefore, the chip bump 32' may include a lower portion 32_L and an upper portion 32_U of an asymmetrical structure.

In semiconductor packages of the various modified examples described below, although there is no separate description of "bumps", the semiconductor packages of the various modified examples may include the bumps (32 of FIGS. 1 and 2) having a symmetrical structure, as illustrated in FIGS. 1 and 2, or the bumps (32' of FIG. 3) having an asymmetrical structure.

Next, various modified examples of a semiconductor package according to some embodiments of the present inventive concept will be illustrated in FIGS. 4 to 11. FIGS. 4 to 11 are cross-sectional views illustrating modified examples of a semiconductor package according to some embodiments of the present inventive concept. Hereinafter, in describing various modified examples of a semiconductor package according to an embodiment of the present inventive concept with reference to FIGS. 4 to 11, modified portions of the semiconductor package 1 according to embodiments such as illustrated in FIG. 1 may be mainly described. Therefore, in FIGS. 4 to 11, descriptions of elements denoted by the same numerals as those of FIG. 1 will be omitted. In FIGS. 4 to 11, elements denoted by the same numerals as those of FIG. 1 may be directly cited without further explanation thereof, and modified portions of FIGS. 4 to 11 may be described at the same time. In addition, in describing the modified examples with reference to FIGS. 4 to 11, an element, differently from the number of FIG. 1, but referred to by the same terms as those illustrated in FIG. 1, will be described mainly based on the modified portions of the element illustrated in FIG. 1.

Figure 4:
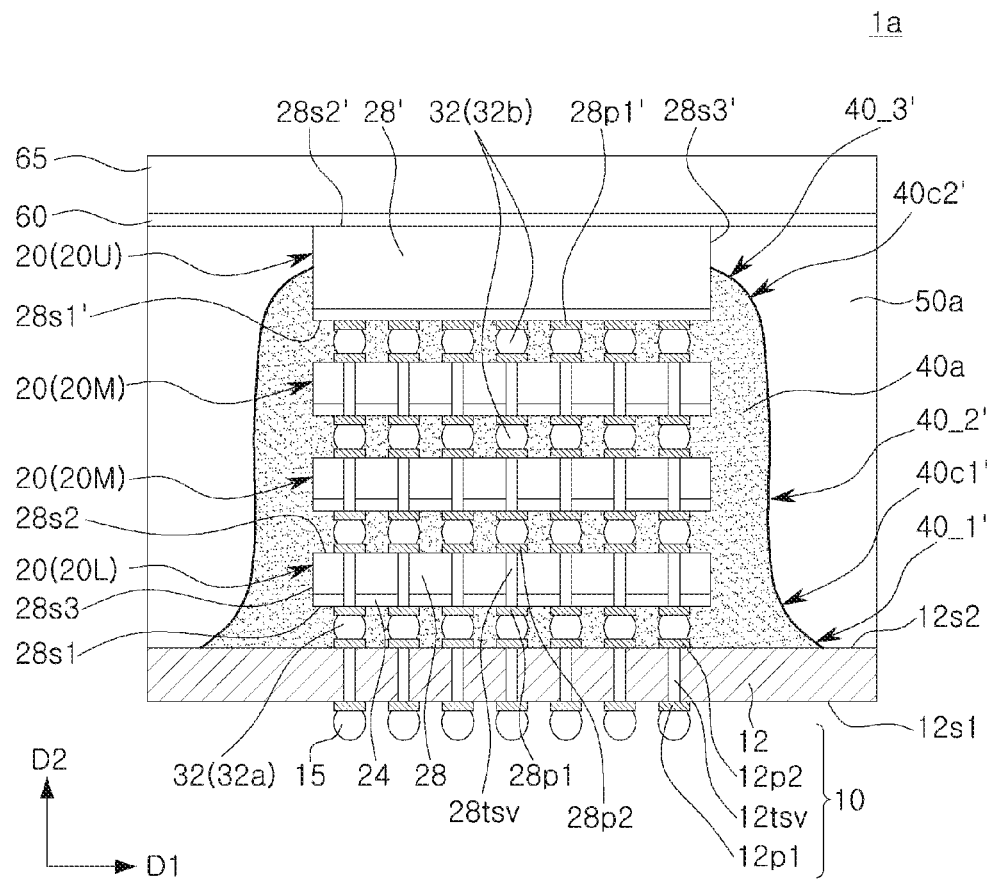
FIGS. 4 to 11 are cross-sectional views illustrating modified examples of a semiconductor package according to some embodiments of the present inventive concept.

In a modified example, referring to FIG. 4, a semiconductor package 1*a* in the modified example may include an underfill material layer 40*a* covering a portion of the side surface 28*s*3' of the upper chip 20U, and a mold layer 50*a* contacting the underfill material layer 40*a*.

The underfill material layer 40*a* may be in contact with a portion of the side surface 28*s*3' of the upper chip 20U. The mold layer 50*a* may be in contact with the underfill material layer 40*a*, and may be in contact with a remaining portion of the side surface 28*s*3' of the upper chip 20U not contacting the fill material layer 40*a*. Therefore, a lower portion of the side surface 28*s*3' of the upper chip 20U may be in contact with the underfill material layer 40*a*, and an upper portion of the side surface 28*s*3' of the upper chip 20U may be in contact with the mold layer 50*a*.

The underfill material layer 40*a* may include a first side portion 40_1' adjacent to the substrate 10, a second side portion 40_2' having a slope, steeper than a slope of the first side portion 40_1', a third side portion 40_3' having a slope, gentler or less steep than a slope of the second side portion 40_2', a first curved portion 40*c*1' disposed between the first side portion 40_1' and the second side portion 40_2', and a second curved portion 40*c*2' disposed between the second side portion 40_2' and the third side portion 40_3'.

The second side portion 40_2' of the underfill material layer 40*a* may be substantially perpendicular to the upper surface 12*s*2 of the substrate 10.

The underfill material layer 40*a* may include the lower portion (40L of FIG. 1) and the interlayer portion (40U of FIG. 1) illustrated in FIG. 1. It may be understood that elements using the term "underfill material layer" in FIGS. 5 to 11 below include the lower portion (40L of FIG. 1) and the interlayer portion (40U of FIG. 1) illustrated in FIG. 1, unless otherwise noted.

Figure 5:
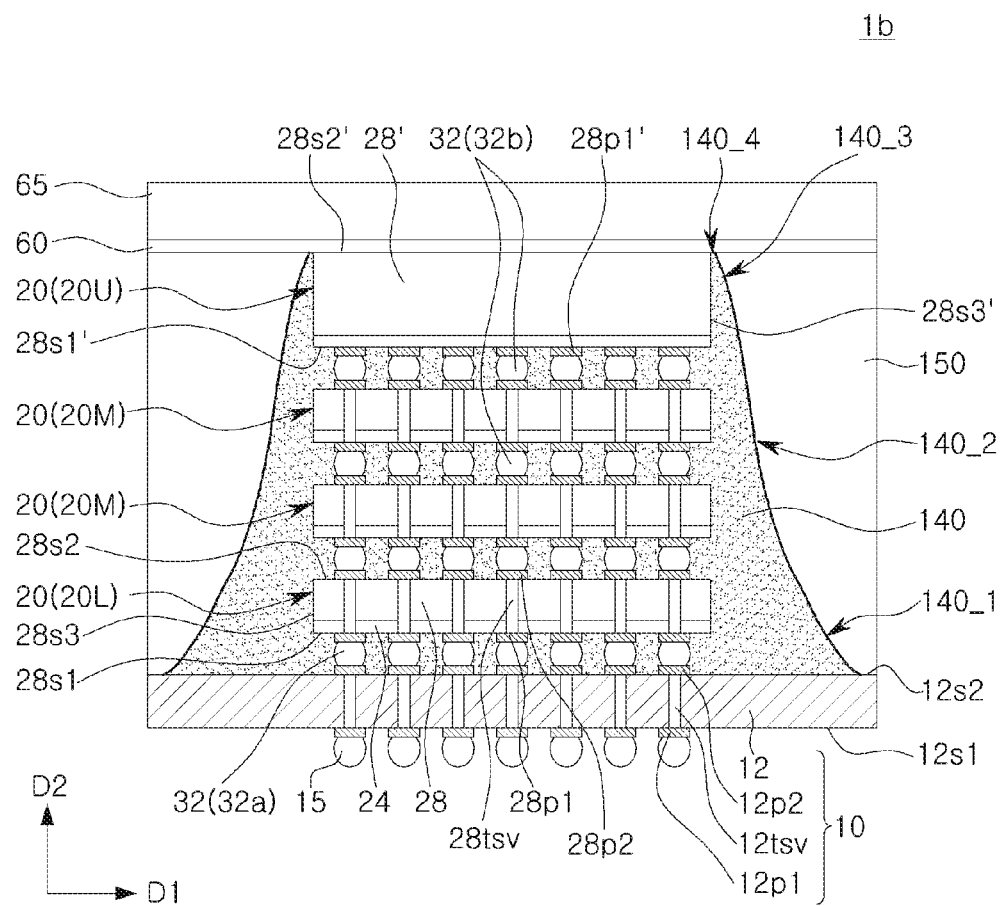

In some embodiments, referring to FIG. 5, a semiconductor package 1*b* in the modified example may include an underfill material layer 140 including a first side portion 140_1 adjacent to the substrate 10, a second side portion 140_2 disposed on the first side portion 140_1, having a slope, steeper than a slope of the first side portion 140_1, and having a slope gentler or less steep than 90 degrees, a third side portion 140_3 having a slope, gentler or less steep than a slope of the second side portion 140_2, and an upper surface 140_4 contacting the heat transfer material layer 60, and a mold layer 150 contacting the underfill material layer 140.

Figure 6:
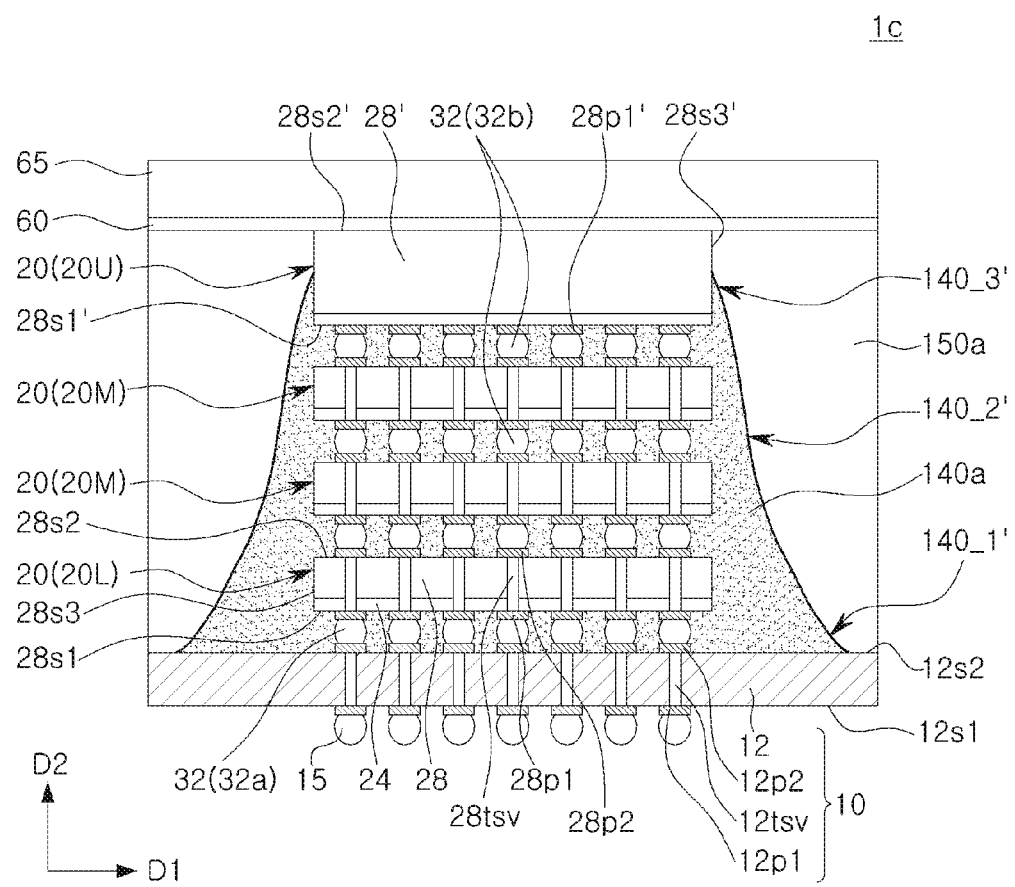

In some embodiments, referring to FIG. 6, a semiconductor package 1*c* in the modified example may include an underfill material layer 140*a* including a first side portion 140_1' adjacent to the substrate 10, a second side portion 140_2' disposed on the first side portion 140_1', having a slope, steeper than a slope of the first side portion 140_1', and having a slope gentler or less steep than 90 degrees, and a third side portion 140_3' having a slope, gentler or less steep than a slope of the second side portion 140_2' and covering or overlapping a portion of the side surface 28s3' of the upper chip 20U, and a mold layer 150a contacting the underfill material layer 140a and contacting a remaining portion of the side surface 28s3' of the upper chip 20U, not covering the underfill material layer 140a.

Figure 7:
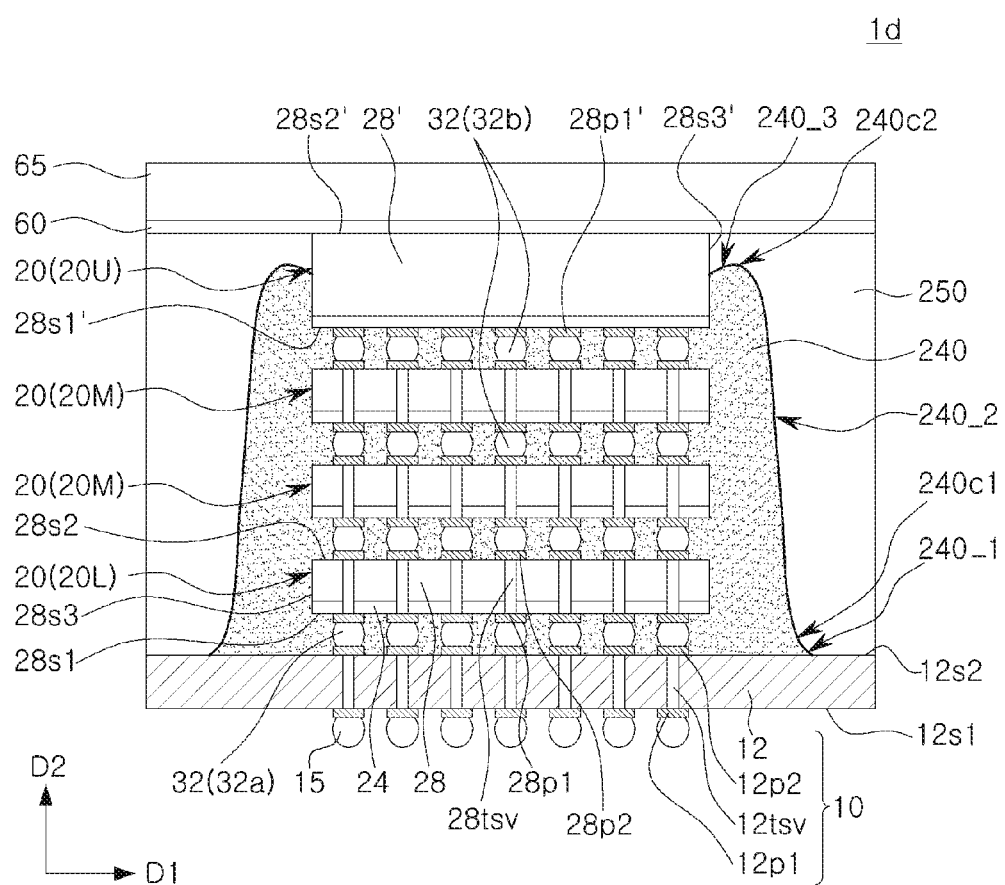

In some embodiments, referring to FIG. 7, a semiconductor package 1d in the modified example may include an underfill material layer 240 including a first side portion 240_1 adjacent to the substrate 10, a second side portion 240_2 disposed on the first side portion 240_1 and having a slope, steeper than a slope of the first side portion 240_1, a first curved portion 240c1 disposed between the first side portion 240_1 and the second side portion 240_2, a second curved portion 240c2 extending from the second side portion 240_2, and a third side portion 240_3 extending from the second curved portion 240c2 to the side surface 28s3' of the upper chip 20U, and a mold layer 250 covering the underfill material layer 240 and a portion of the side surface 28s3' of the upper chip 20U.

In the underfill material layer 240, the second curved portion 240c2 may be convex in an upward direction.

In the underfill material layer 240, the third side portion 240_3 may be inclined in a direction, spaced apart from the upper surface 12s2 of the substrate 10, as the third side portion is spaced apart from a portion contacting the side surface 28s3' of the upper chip 20U.

Figure 8:
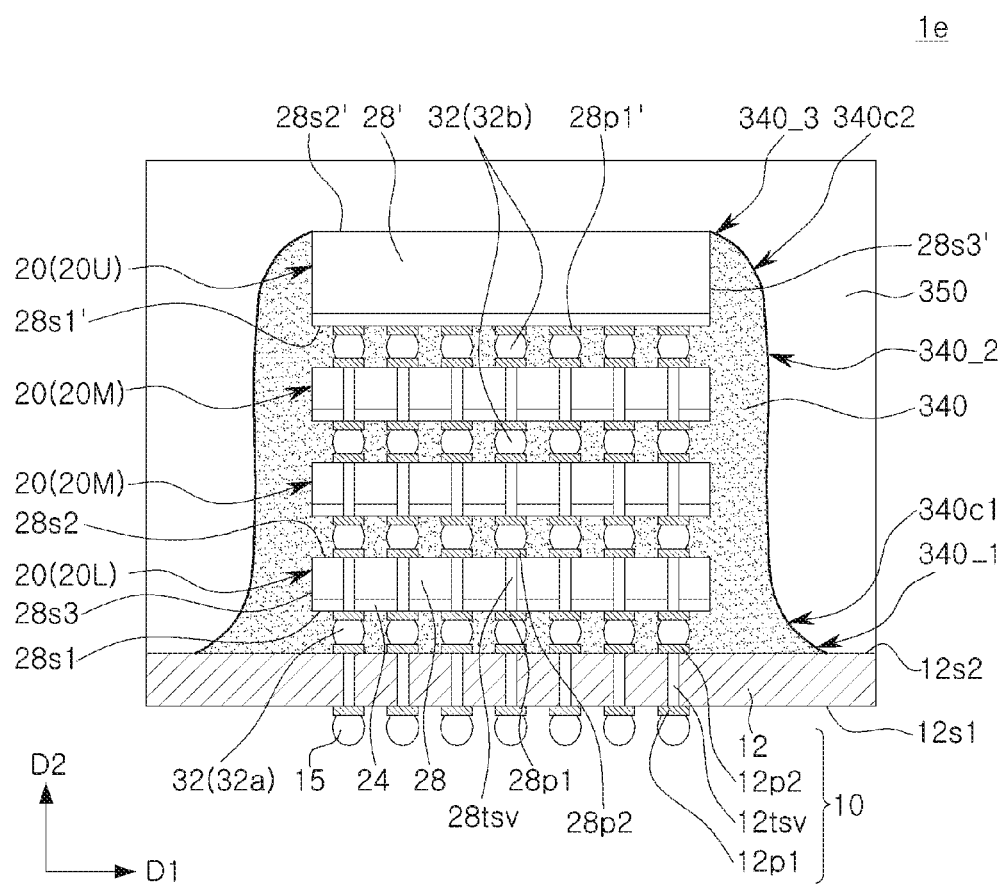

In another modified example, referring to FIG. 8, a semiconductor package 1e in the modified example may include an underfill material layer 340 including a first side portion 340_1 adjacent to the substrate 10, a second side portion 340_2 disposed on the first side portion 340_1 and having a slope, steeper than a slope of the first side portion 340_1, a first curved portion 340c1 disposed between the first side portion 340_1 and the second side portion 340_2, a second curved portion 340c2 extending from the second side portion 340_2, and a third side portion 340_3 extending from the second curved portion 340c2, and a mold layer 350 covering the underfill material layer 340 and covering the second surface 28s 2' of the upper chip 20U.

The second side portion 340_2 may be substantially perpendicular to the upper surface 12s2 of the substrate 10.

The second side portion 340_2 may overlap two or more chips, among the plurality of stacked chips 20, in the horizontal direction (D1).

The underfill material layer 340 may entirely cover the side surfaces 28s3 and 28s3' of the plurality of stacked chips 20.

In some embodiments, the semiconductor package 1e may not include the heat transfer material layer (60 of FIG. 1) and the heat dissipation member (65 of FIG. 1), illustrated in FIG. 1.

In another example, in the semiconductor package 1e, the heat transfer material layer (60 of FIG. 1) and the heat dissipation member (65 of FIG. 1), illustrated in FIG. 1, may be arranged on the mold layer 350.

Figure 9:
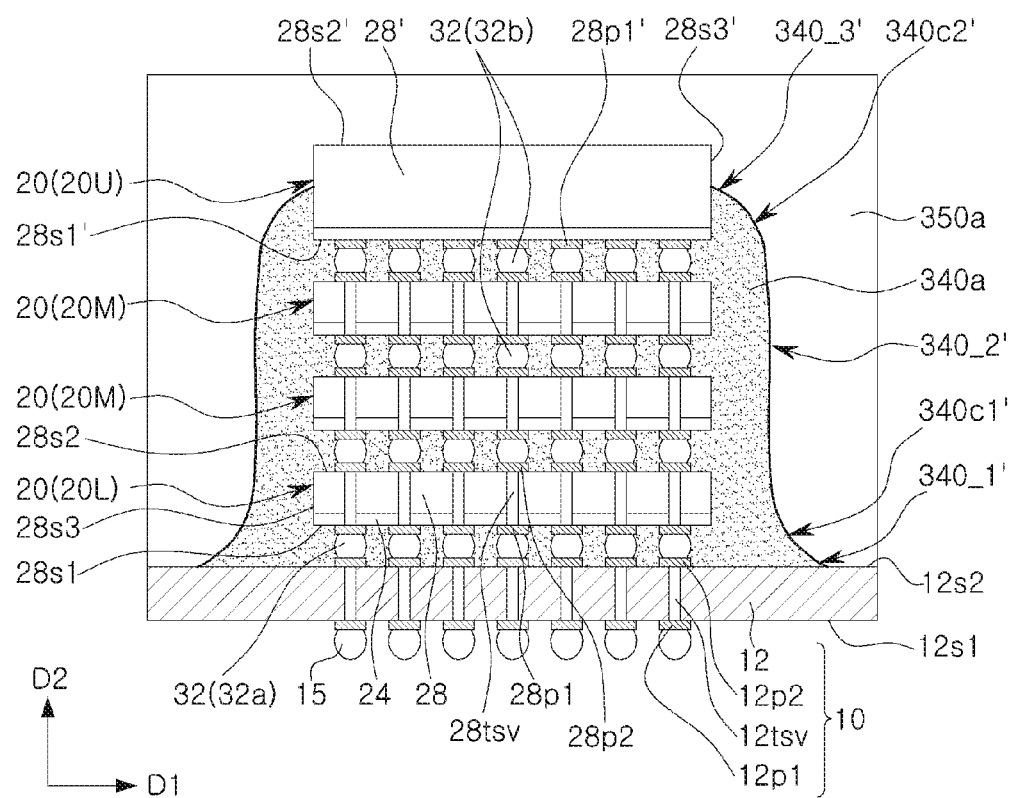

In another modified example, referring to FIG. 9, a semiconductor package 1f in the modified example may include an underfill material layer 340a including a first side portion 340_1' adjacent to the substrate 10, a second side portion 340_2' disposed on the first side portion 340_1' and having a slope, steeper than a slope of the first side portion 340_1', a first curved portion 340c1' disposed between the first side portion 340_1' and the second side portion 340_2', a second curved portion 340c2' extending from the second side portion 340_2', and a third side portion 340_3' extending from the second curved portion 340c2', and a mold layer 350a covering or overlapping the underfill material layer 340a and covering or on a portion of the side surface 28s3' of the upper chip 20U and the second surface 28s2' of the upper chip 20U.

The underfill material layer 340a may be in contact with the portion of the side surface 28s3' of the upper chip 20U, and the mold layer 350a may cover or overlap the underfill material layer 340a, and may be in contact with a remaining portion of the side surface 28s3' of the upper chip 20U, not contacting the underfill material layer 340a.

Figure 10:
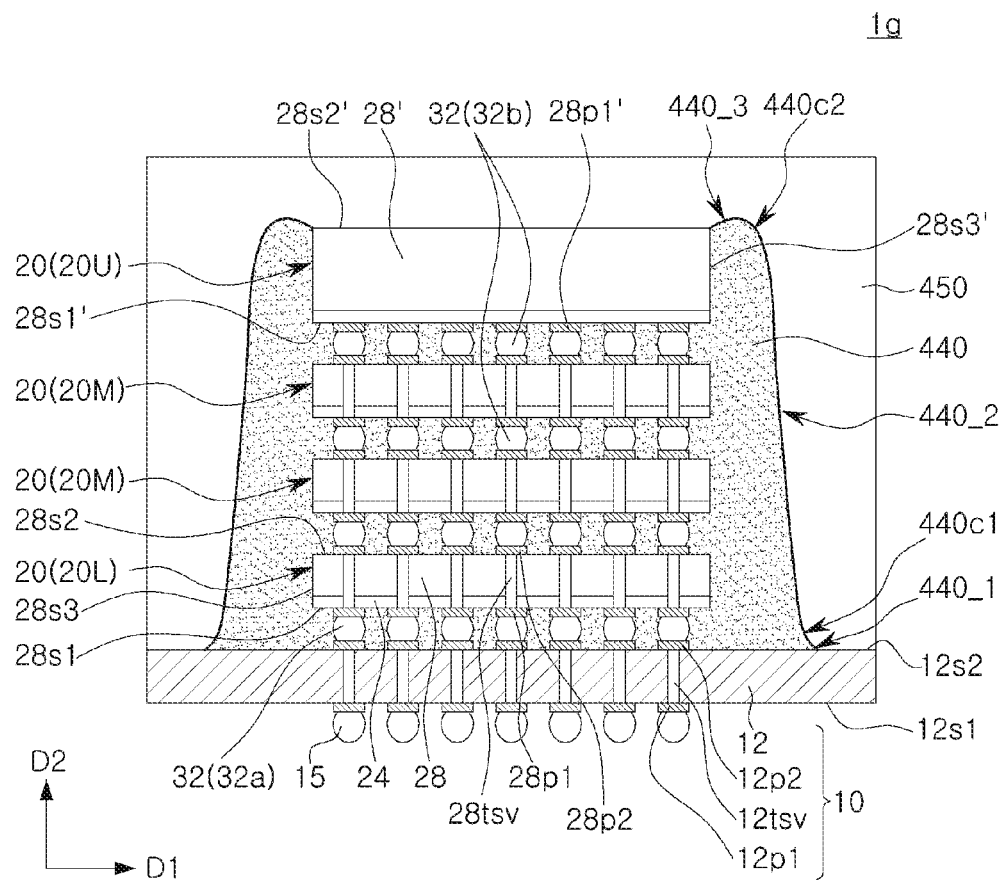

In some embodiments, referring to FIG. 10, a semiconductor package 1g in the modified example may include an underfill material layer 440 including a first side portion 440_1 adjacent to the substrate 10, a second side portion 440_2 disposed on the first side portion 440_1 and having a slope, steeper than a slope of the first side portion 440_1, a first curved portion 440c1 disposed between the first side portion 440_1 and the second side portion 440_2, a second curved portion 440c2 extending from the second side portion 440_2, and a third side portion 440_3 extending from the second curved portion 440c2 to the upper chip 20U, and a mold layer 450 covering the underfill material layer 440 and the second surface 28s2' of the upper chip 20U.

In the underfill material layer 440, the third side portion 440_3 may be inclined in a direction, spaced apart from the upper surface 12s2 of the substrate 10, as the third side portion is spaced apart from the side surface 28s3' of the upper chip 20U.

In the underfill material layer 440, the second curved portion 440c2 may be convex in an upward direction. In the underfill material layer 440, an upper end of the second curved portion 440c2 may be higher than the second surface 28s2' of the upper chip 20U. For example, a distance between the upper end of the second curved portion 440c2 of the underfill material layer 440 and the upper surface 12s2 of the substrate 10 may be greater than a distance between the second surface 28s2' of the upper chip 20U and the upper surface 12s2 of the substrate 10.

Figure 11:
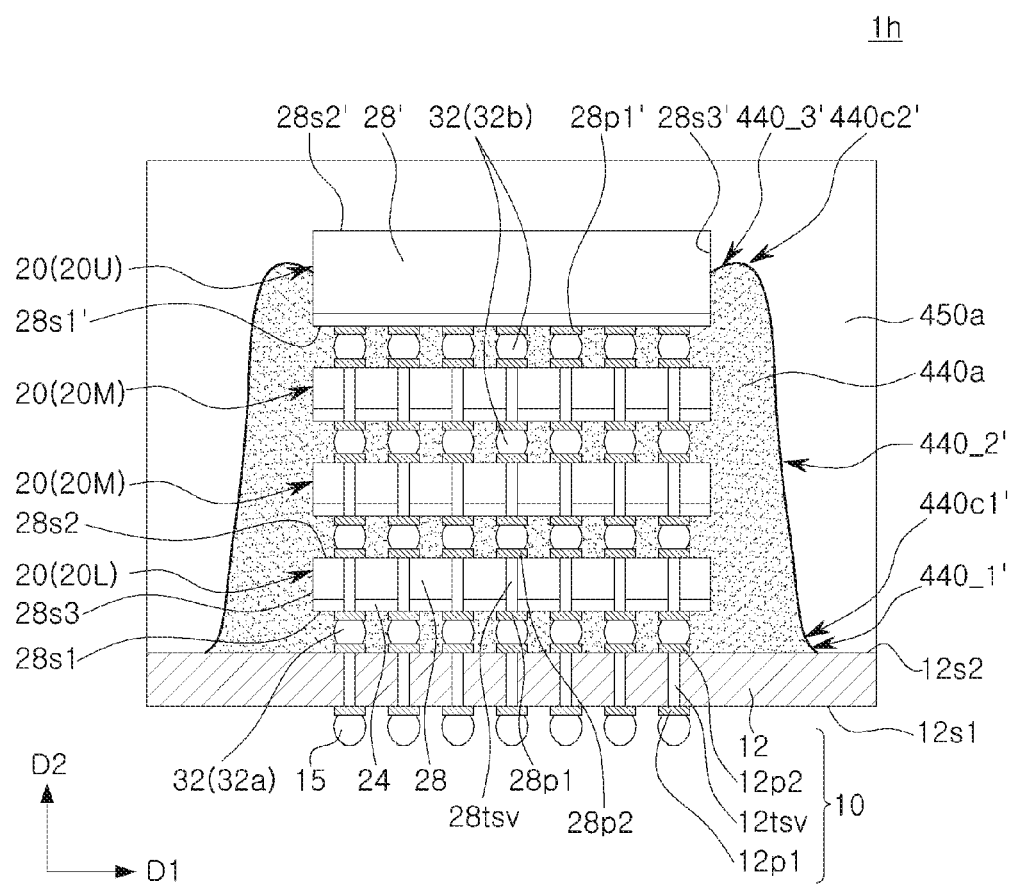

In some embodiments, referring to FIG. 11, a semiconductor package 1h in the modified example may include an underfill material layer 440a including a first side portion 440_1' adjacent to the substrate 10, a second side portion 440_2' disposed on the first side portion 440_1' and having a slope, steeper than a slope of the first side portion 440_1', a first curved portion 440c1' disposed between the first side portion 440_1' and the second side portion 440_2', a second curved portion 440c2' extending from the second side portion 440_2', and a third side portion 440_3' extending from the second curved portion 440c2' to the upper chip 20U, and a mold layer 450a covering the underfill material layer 440a and a portion of the side surface 28s3' of the upper chip 20U and covering the second surface 28s2' of the upper chip 20U.

In the underfill material layer 440a, the third side portion 440_3' may be inclined in a direction, spaced apart from the upper surface 12s2 of the substrate 10, as the third side portion is spaced apart from the side surface 28s3' of the upper chip 20U. In the underfill material layer 440a, the second curved portion 440c2' may be convex in an upward direction.

The mold layer 450a may be in contact with a portion of the side surface 28s3' of the upper chip 20U, and may be in contact with a remaining portion of the side surface 28s3' of the upper chip 20U, not covering by the mold layer 450a.

As illustrated in FIGS. 1 to 11, the semiconductor packages 1a to 1h according to some embodiments of the present inventive concept may include the plurality of stacked chips 20, and the underfill material layer (40 of FIG. 1, 40a of FIG.

Figure 12:
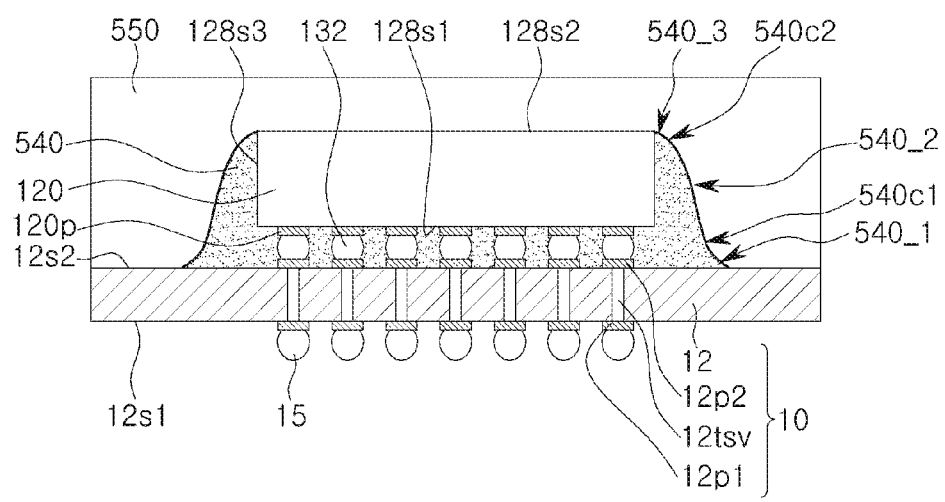
FIG. 12 is a cross-sectional view illustrating a semiconductor package according to some embodiments of the present inventive concept.

4, 140 of FIG. 5, 140a of FIG. 6, 240 of FIG. 7, 340 of FIG. 8, 340a of FIG. 9, 440 of FIG. 10, or 440a of FIG. 11) covering the side surfaces 28s3 and 28s3' of the stacked chips 20. The technical concept of the present inventive concept is not limited thereto. For example, some embodiments of the present inventive concept may provide a semiconductor package including an underfill material layer covering a side surface of a chip. Hereinafter, an example of the underfill material layer covering the side surface of the chip will be illustrated in FIG. 12. FIG. 12 is a cross-sectional view illustrating a semiconductor package according to some embodiments of the present inventive concept.

First, referring to FIG. 12, a semiconductor package 1i in some embodiments may include a substrate 10 and substrate bumps 15, substantially the same as those illustrated in FIG. 1. The semiconductor package 1i may further include a chip 120, chip bumps 132, an underfill material layer 540, and a mold layer 550. Since the substrate 10 and the substrate bumps 15 are illustrated in FIG. 1, detailed descriptions of the substrate 10 and the substrate bumps 15 will be omitted.

The chip 120 may be a semiconductor chip. The chip 120 may have a first surface 128s1 and a second surface 128s2 opposing each other. The first surface 128s1 of the chip 120 may face an upper surface 12s2 of the substrate 10. The chip 120 may include chip pads 120p disposed on the first surface 128s1 of the chip 120.

In some embodiments, the chip 120 may have a substantially same cross-sectional structure as the upper chip (20U of FIG. 1).

The chip bumps 132 may contact the chip pads 120p of the chip 120 and second substrate pads 12p2 of the substrate 10.

The underfill material layer 540 may fill a space between the chip 120 and the substrate 10, may surround side surfaces of the chip bumps 132, and may extend onto a side surface 128s3 of the chip 120. The underfill material layer 540 may entirely contact the side surface 128s3 of the chip 120.

The underfill material layer 540 may be integrally formed. For example, the underfill material layer 540 may not have a boundary or interface between a portion filling the space between the chip 120 and the substrate 10 and a portion extending onto the side surface 128s3 of the chip 120.

The underfill material layer 540 may include a first side portion 540_1 adjacent to the substrate 10, a second side portion 540_2 disposed on the first side portion 540_1 and having a slope, steeper than a slope of the first side portion 540_1, a first curved portion 540c1 disposed between the first side portion 540_1 and the second side portion 540_2, a third side portion 540_3 disposed on the second side portion 540_2 and having a slope, gentler or less steep than the slope of the second side portion 540_2, and a second curved portion 540c2 disposed between the second side portion 540_2 and the third side portion 540_3.

In an example, the mold layer 550 may be disposed on the substrate 10, may cover the underfill material layer 540, and may cover the second surface 128s2 of the chip 120.

In some embodiments, the mold layer 550 may be modified to expose the second surface 128s2 of the chip 120, as in the mold layer (50 of FIG. 1) illustrated in FIG. 1.

In some embodiments, the semiconductor package 1i may be modified to further include the heat transfer material layer (60 of FIG. 1) and the heat dissipation member (65 of FIG. 1), as illustrated in FIG. 1. For example, the mold layer 550 may be modified to expose the second surface 128s2 of the chip 120, as in the mold layer (50 of FIG. 1) illustrated in FIG. 1. The heat transfer material layer (60 of FIG. 1) and the heat dissipation member (65 of FIG. 1), as illustrated in FIG. 1, may be arranged on the chip 120 and the mold layer 550.

Figure 13:
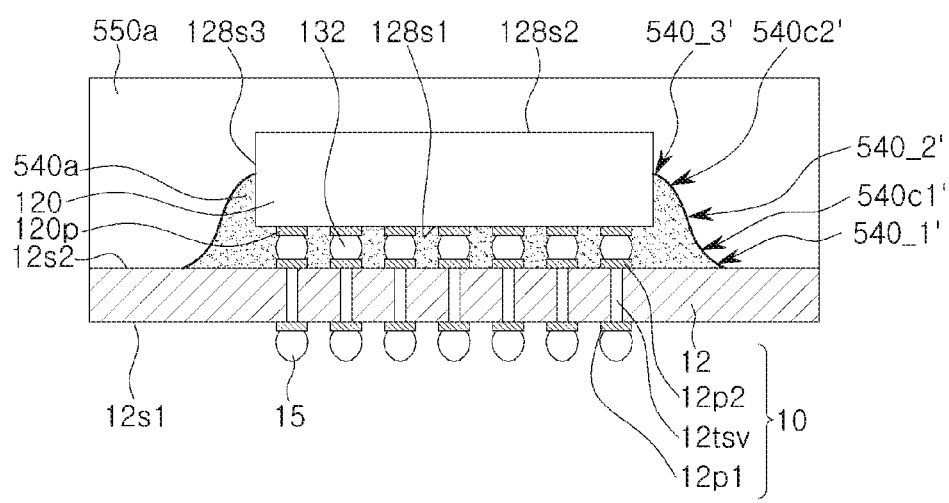
FIGS. 13 to 15 are cross-sectional views illustrating modified examples of a semiconductor package according to some embodiments of the present inventive concept.
Figure 14:
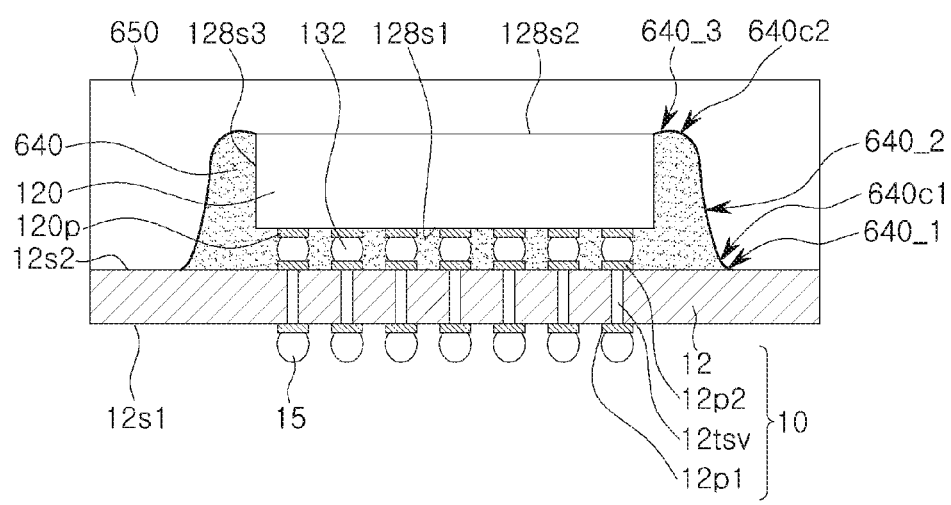
Figure 15:
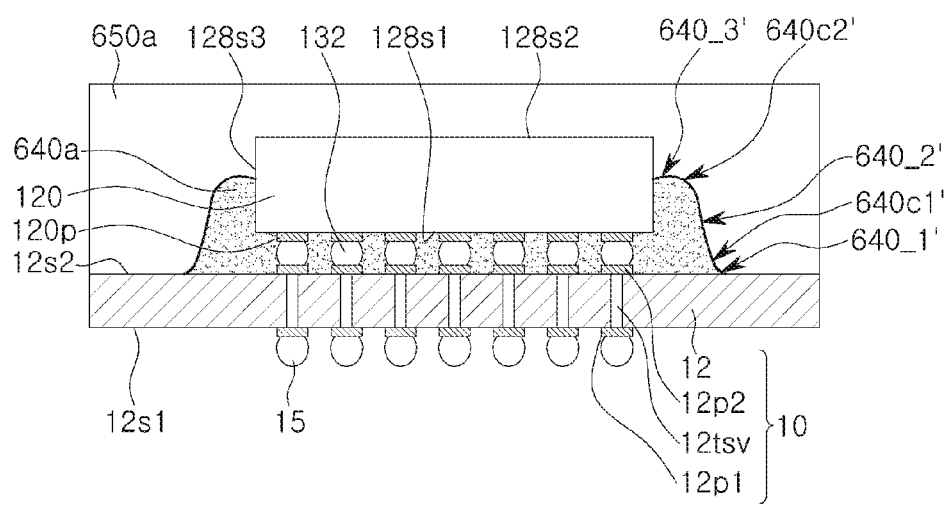

FIGS. 13 to 15 are cross-sectional views illustrating modified examples of a semiconductor package according to some embodiments of the present inventive concept. Hereinafter, in describing various modified examples of a semiconductor package according to another embodiment of the present inventive concept with reference to FIGS. 13 to 15, modified portions of the semiconductor package 1i according to embodiments illustrated in FIG. 12 may be mainly described. Therefore, in FIGS. 13 to 15, descriptions of elements denoted by the same numerals as those of FIG. 12 will be omitted. In addition, in describing the modified example with reference to FIG. 13 to FIG. 15, an element, different from the number of FIG. 12, but referred to by the same terms as those illustrated in FIG. 12, will be described mainly based on the modified portions of the element illustrated in FIG. 12.

In some embodiments, referring to FIG. 13, a semiconductor package 1j may include an underfill material layer 540a filling a space between the chip 120 and the substrate 10 and contacting a portion of the side surface 128s3 of the chip 120, and a mold layer 550a covering or overlapping the underfill material layer 540a and contacting the side surface 128s3 of the chip 120, but not contacting the underfill material layer 540a.

The underfill material layer 540a may include a first side portion 540_1' adjacent to the substrate 10, a second side portion 540_2' disposed on the first side portion 540_1' and having a slope, steeper than a slope of the fifth side portion 540_1', a third side portion 540_3' having a slope, gentler or less steep than a slope of the second side portion 540_2', a first curved portion 540c1' disposed between the first side portion 540_1' and the second side portion 540_2', and a second curved portion 540c2' disposed between the second side portion 540_2' and the third side portion 540_3'.

In some embodiments, referring to FIG. 14, a semiconductor package 1k in the modified example may include an underfill material layer 640 filling a space between the chip 120 and the substrate 10, entirely covering the side surface 128s3 of the chip 120, and having an upwardly convex shape, and a mold layer 650 covering the underfill material layer 640.

The underfill material layer 640 may include a first side portion 640_1 adjacent to the substrate 10, a second side portion 640_2 disposed on the first side portion 640_1 and having a slope, steeper than a slope of the first side portion 640_1, a first curved portion 640c1 disposed between the first side portion 640_1 and the second side portion 640_2, a second curved portion 640c2 extending from the second side portion 640_2, and a third side portion 640_3 extending from the second curved portion 640c2 to the chip 120. In the underfill material layer 640, the second curved portion 640c2 may be convex in an upward direction. Therefore, the third side portion 640_3 may have a slope lowering in a direction toward the chip 120 from the second curved portion 640c2.

In some embodiments, referring to FIG. 15, a semiconductor package 1l in the modified example may include an underfill material layer 640a filling a space between the chip 120 and the substrate 10, contacting a portion of the side surface 128s3 of the chip 120, and having an upwardly convex shape, and a mold layer 650a covering the underfill material layer 640a and contacting the side surface of the chip 120, but not contacting the underfill material layer 640a.

The underfill material layer 640a may include a first side portion 640_1' adjacent to the substrate 10, a second side portion 640_2' disposed on the first side portion 640_1' and having a slope, steeper than a slope of the fifth side portion 640_1', a first curved portion 640c1' disposed between the first side portion 640_1' and the second side portion 640_2', a second curved portion 640c2' extending from the second side portion 640_2', and a third side portion 640_3' extending from the second curved portion 640c2' to the side surface 128s3 of the chip 120. In the underfill material layer 640a, the second curved portion 640c2' may be convex in an upward direction. Therefore, the third side portion 640_3' may have a slope lowering in a direction toward the side surface 128s3 of the chip 120 from the second curved portion 640c2'.

Figure 16:
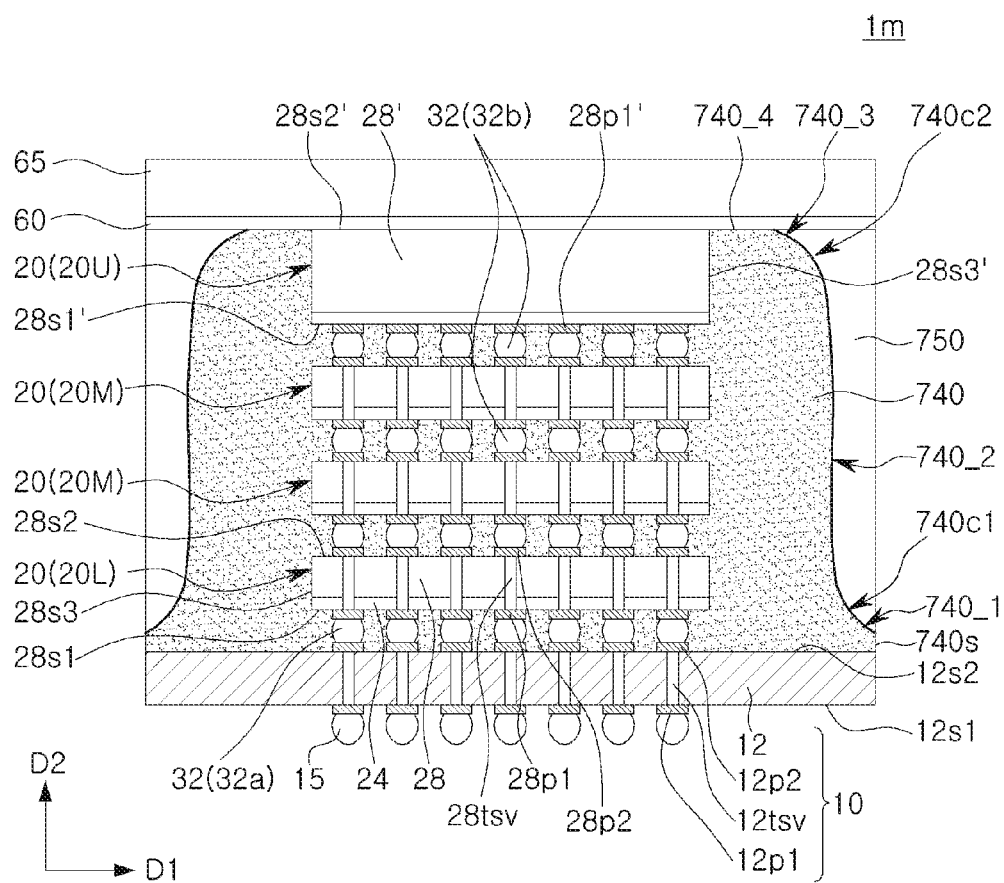
FIG. 16 is a cross-sectional view illustrating a semiconductor package according to some embodiments of the present inventive concept.

In the above-described various semiconductor packages 1i to 11 illustrated in FIGS. 1 and 4 to 15, the mold layer (50 of FIG. 1, 50a of FIG. 4, 150 of FIG. 5, 150a of FIG. 6, 250 of FIG. 7, 350 of FIG. 8, 350a of FIG. 9, 450 of FIG. 10, 450a of FIG. 11, 550 of FIG. 12, 550a of FIG. 13, 650 of FIG. 14, or 650a of FIG. 15) may be in contact with the substrate 10. The technical concept of the present inventive concept is not limited thereto. For example, the mold layer (50 of FIG. 1, 50a of FIG. 4, 150 of FIG. 5, 150a of FIG. 6, 250 of FIG. 7, 350 of FIG. 8, 350a of FIG. 9, 450 of FIG. 10, 450a of FIG. 11, 550 of FIG. 12, 550a of FIG. 13, 650 of FIG. 14, or 650a of FIG. 15) in FIGS. 1 and 4 to 15 may be modified to be spaced apart from the substrate 10. In addition, the underfill material layer (40 of FIG. 1, 40a of FIG. 4, 140 of FIG. 5, 140a of FIG. 6, 240 of FIG. 7, 340 of FIG. 8, 340a of FIG. 9, 440 of FIG. 10, 440a of FIG. 11, 540 of FIG. 12, 540a of FIG. 13, 640 of FIG. 14, or 640a of FIG. 15) illustrated in FIGS. 1 and 4 to 15 may be modified to extend between the substrate 10 and the mold layer (50 of FIG. 1, 50a of FIG. 4, 150 of FIG. 5, 150a of FIG. 6, 250 of FIG. 7, 350 of FIG. 8, 350a of FIG. 9, 450 of FIG. 10, 450a of FIG. 11, 550 of FIG. 12, 550a of FIG. 13, 650 of FIG. 14, or 650a of FIG. 15). An example of the mold layer and the underfill material layer that may be modified, as described above, will be illustrated in FIG. 16. FIG. 16 is a cross-sectional view illustrating a modified example such that the mold layer (50 of FIG. 1), illustrated in FIG. 1, is modified to be spaced apart from the substrate (10 of FIG. 1), and the underfill material layer (40 of FIG. 1), illustrated in FIG. 1, is modified to extend between the mold layer (50 of FIG. 1) and the substrate (10 of FIG. 1). In describing a modified example of the semiconductor package with reference to FIG. 16, description of elements overlapping the elements illustrated in FIG. 1 will be omitted, or elements denoted by the same numerals as those of FIG. 1 may be directly cited without further explanation thereof, and modified portions of FIG. 1 may be described at the same time.

In some embodiments, referring to FIG. 16, a semiconductor package 1m may include a mold layer 750 spaced apart from the substrate 10, and an underfill material layer 740 including a portion interposed between the substrate 10 and the mold layer 750.

The underfill material layer 740 may include an outer surface 740s that may be aligned with an outer surface 750s of the mold layer 750.

The underfill material layer 740 may include a first side portion 740_1 extending from the outer surface 740s of the underfill material layer 740, a second side portion 740_2 disposed on the first side portion 740_1 and having a slope, steeper than a slope of the first side portion 740_1, and a first curved portion 740c1 disposed between the first side portion 740_1 and the second side portion 740_2.

The underfill material layer 740 further includes a third side portion 740_3 disposed on the second side portion 740_2 and having a slope, gentler or less steep than a slope of the second side portion 740_2, and a second curved portion 740c2 disposed between the third side portion 740_3 and the second side portion 740_2.

In some embodiments, an upper surface 740_4 of the underfill material layer 740 may be coplanar with the second surface 28s2' of the upper chip 20U.

In some embodiments, the upper surface 740_4 of the underfill material layer 740 and the second surface 28s2' of the upper chip 20U may contact the heat transfer material layer 60.

Next, various examples of a semiconductor package according to some embodiments of the present inventive concept will be illustrated in FIGS. 17A to 17D. FIGS. 17A to 17D are conceptual cross-sectional views for describing various examples of a semiconductor package according to some embodiments of the present inventive concept.

Figure 17A:
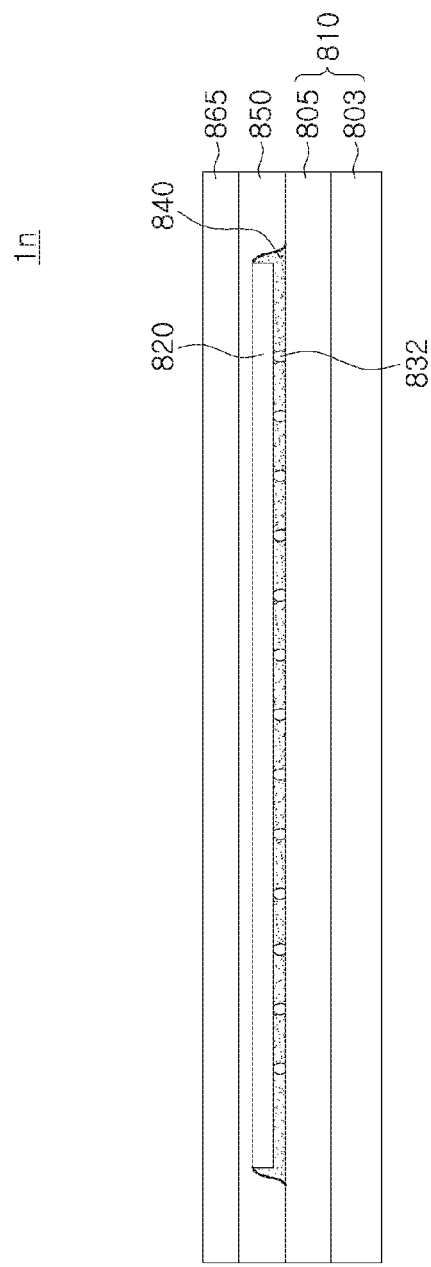
FIGS. 17A to 17D are cross-sectional views illustrating semiconductor packages according to embodiments of the present inventive concept.

In some embodiments, referring to FIG. 17A, a semiconductor package 1n may include a substrate 810, a semiconductor chip 820 on the substrate 810, bumps 832 disposed between the semiconductor chip 820 and the substrate 810, and an underfill material layer 840 filling a space between the substrate 810 and the semiconductor chip 820, surrounding side surfaces of the bumps 832, and extending onto a side surface of the semiconductor chip 820.

In some embodiments, the substrate 810 may include at least one of a CMOS image sensor chip 803 and a logic chip 805. For example, the substrate 810 may include any one of the CMOS image sensor chip 803 and the logic chip 805. In some embodiments, the substrate 810 may include both the CMOS image sensor chip 803 and the logic chip 805. When the substrate 810 includes both the CMOS image sensor chip 803 and the logic chip 805, the logic chip 805 may be disposed between the semiconductor chip 820 and the CMOS image sensor chip 803. The logic chip 805 may be a processor chip. The semiconductor chip 820 may be a memory chip, for example, a DRAM chip.

The underfill material layer 840 may have substantially the same shape as any of the underfill material layers (540 of FIG. 12, 540a of FIG. 13, 640 of FIG. 14, and 640a of FIG. 15) of various shapes illustrated in FIGS. 12 to 15.

In some embodiments, the semiconductor package 1n may further include a mold layer 850 disposed on the substrate 810 and covering or overlapping the semiconductor chip 820 and the underfill material layer 840.

In some embodiments, the semiconductor package 1n may further include a heat dissipation member 865 on the mold layer 850, for example, a heat sink.

Figure 17B:
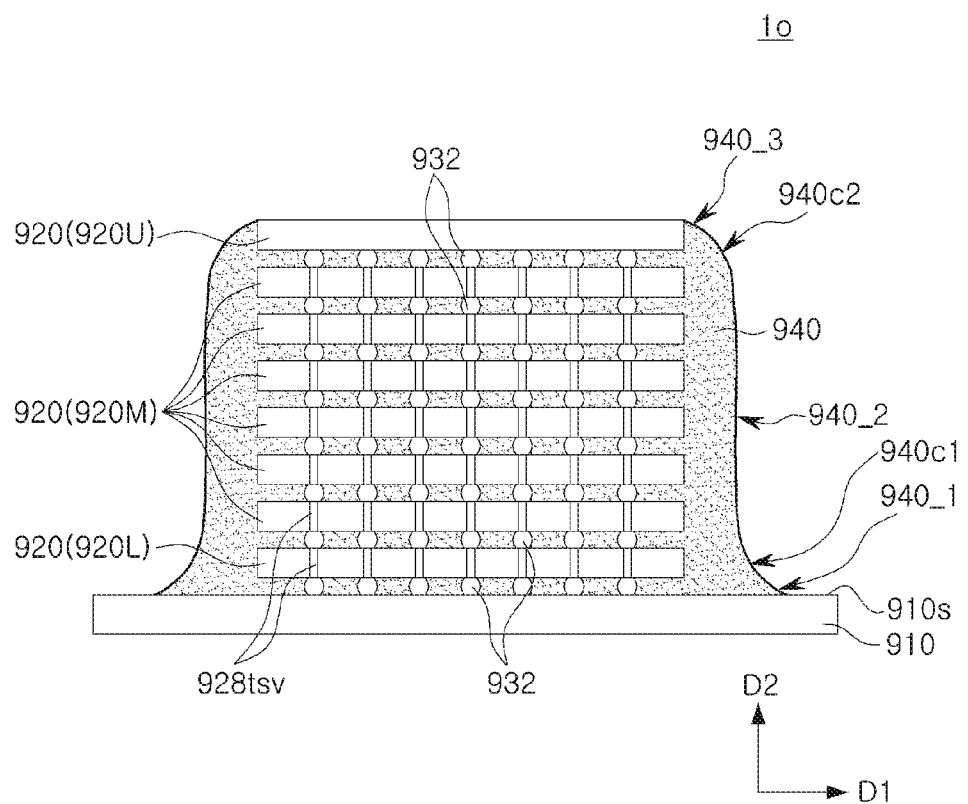

In some embodiments, referring to FIG. 17B, a semiconductor package 1o in the modification may include a substrate 910, a plurality of stacked chips 920 stacked on the substrate 910 in a vertical direction (D2), perpendicular to an upper surface 910s of the substrate 910, and bumps 932 disposed below each of the plurality of stacked chips 920.

The plurality of stacked chips 920 may include a lower chip 920L, an upper chip 920U, and intermediate chips 920M disposed between the lower chip 920L and the upper chip 920U.

The lower and intermediate chips 920L and 920M may include through electrode structures 928tsv passing through the lower and intermediate chips 920L and 920M, respectively, and electrically connected to the bumps 932.

The semiconductor package 1o may further include an underfill material layer 940 filling a space between the lower chip 920L and the substrate 910, filling a space between chips 920 adjacent to each other in the vertical direction (D2), surrounding side surfaces of the bumps 932, and extending onto side surfaces of the plurality of stacked chips 920.

The underfill material layer 940 may have substantially the same shape as any of the underfill material layers (340 of FIG. 8, 340*a* of FIG. 9, 440 of FIG. 10, and 440*a* of FIG. 11) illustrated in FIGS. 8 to 11. For example, similar to the underfill material layer (340 of FIG. 8) illustrated in FIG. 8, the underfill material layer 940 may include a first side portion 940_1 adjacent to the substrate 910, a second side portion 940_2 disposed on the first side portion 940_1 and having a slope, steeper than a slope of the first side portion 940_1, a first curved portion 940*c*1 disposed between the first side portion 940_1 and the second side portion 940_2, a second curved portion 940*c*2 extending from the second side portion 940_2, and a third side portion 940_3 extending from the second curved portion 940*c*2.

In some embodiments, the second side portion 940_2 may have a substantially constant slope or a substantially constant varying slope.

In an example, at least one of the upper chip 920U and the lower chip 920L may not overlap the second side portion 940_2 in a horizontal direction (D1). The horizontal direction (D1) may be parallel to the upper surface 910*s* of the substrate 910.

In some embodiments, at least two chips 920M adjacent to each other in the vertical direction (D2), among the plurality of stacked chips 920, may overlap the second side portion 940_2 having a substantially constant slope or a substantially constant varying slope in the horizontal direction (D1). The horizontal direction (D1) may be a direction parallel to the upper surface 910*s* of the substrate 910.

In some embodiments, the plurality of stacked chips 920 may have the same thickness.

In some embodiments, the plurality of stacked chips 920 may be the same semiconductor chips. For example, the plurality of stacked chips 920 may be a memory semiconductor chip such as a DRAM or a memory semiconductor chip such as a NAND flash. Types of semiconductor chips of the plurality of stacked chips 920 are not limited to the DRAM or the NAND flash, described above. For example, the plurality of stacked chips 920 may be a PRAM, an ReRAM, or an MRAM.

In some embodiments, the plurality of stacked chips 920 may include different kinds of semiconductor chips. For example, one of the plurality of stacked chips 920 may be a logic semiconductor chip or a processor chip, and one or a plurality of remaining chips may be a memory semiconductor chip. For example, in the plurality of stacked chips 920, the lower chip 920L may be a logic semiconductor chip or a process chip, and the intermediate and upper chips 920M and 920U may be memory semiconductor chips.

In some embodiments, the upper chip 920U among the plurality of stacked chips 920 may be a CMOS image sensor.

Figure 17C:
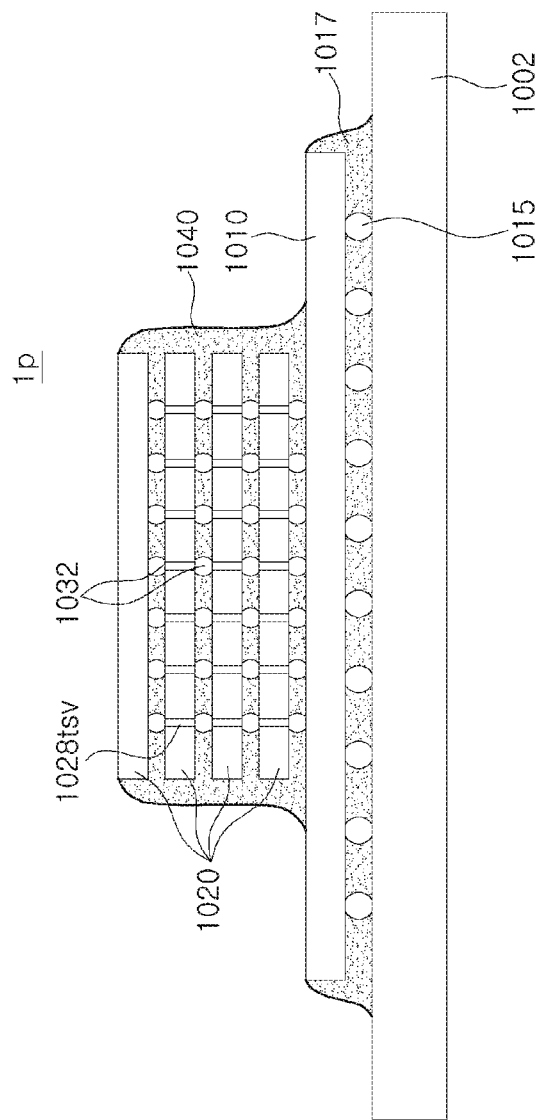

In some embodiments, referring to FIG. 17C, a semiconductor package 1*p* may include a substrate 1002, a first semiconductor chip 1010 disposed on the substrate 1002, first bumps 1015 disposed between the first semiconductor chip 1010 and the substrate 1002, a first underfill material layer 1017 surrounding side surfaces of the first bumps 1015, filling a space between the first semiconductor chip 1010 and the substrate 1002, and extending onto a side surface of the first semiconductor chip 1010, second semiconductor chips 1020 stacked on the first semiconductor chip 1010 in a vertical direction perpendicular to an upper surface of the first semiconductor chip 1010, second bumps 1032 disposed below each of the second semiconductor chips 1020, and a second underfill material layer 1040 surrounding side surfaces of the second bumps 1032 and extending onto side surfaces of the second semiconductor chips 1020.

The second semiconductor chips 1020 may include through electrode structures 1028*tsv* electrically connected to the second bumps 1032.

The first underfill material layer 1017 may have a shape substantially the same as any one of the underfill material layers (540 of FIG. 12, 540*a* of FIG. 13, 640 of FIG. 14, and 640*a* of FIG. 15) illustrated in FIGS. 12 to 15.

The second underfill material layer 1040 may have a shape substantially the same as any one of the underfill material layers (340 of FIG. 8, 340*a* of FIG. 9, 440 of FIG. 10, and 440*a* of FIG. 11) illustrated in FIGS. 8 to 11.

In some embodiments, the substrate 1002 may be a printed circuit board, the first semiconductor chip 1010 may be a semiconductor chip such as a controller, and the second semiconductor chips 1020 may be memory semiconductor chips, for example, volatile memories such as DRAMs or the like, or nonvolatile memories such as NAND flashes or the like.

Figure 17D:
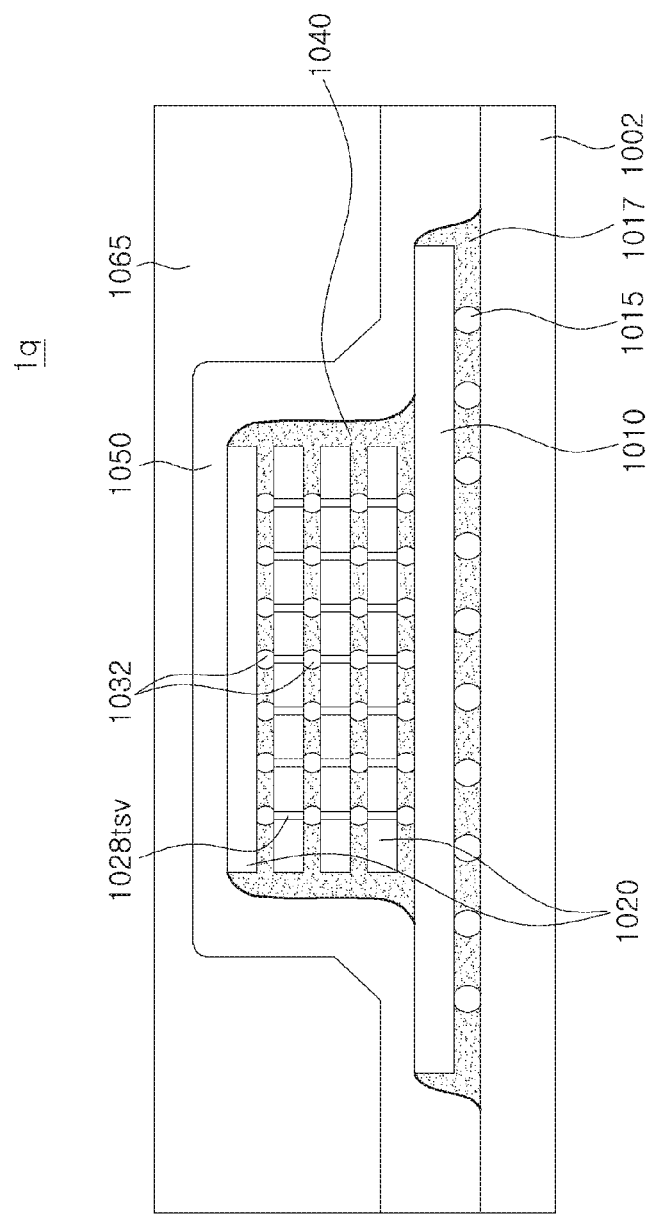

Next, a modified example of a semiconductor package according to some embodiments of the present inventive concept will be illustrated in FIG. 17D.

In some embodiments, referring to FIG. 17D, a semiconductor package 1*q* may include the substrate 1002, the first semiconductor chip 1010, the first bumps 1015, the first underfill material layer 1017, the second semiconductor chips 1020, the second bumps 1032, and the second underfill material layer 1040, as illustrated in FIG. 17C. The semiconductor package 1*q* may further include an insulating material layer 1050 disposed on the substrate 1002 and covering or overlapping the first semiconductor chip 1010, the first underfill material layer 1017, the second semiconductor chips 1020, and the second underfill material layer 1040, and a heat dissipation member 1065 disposed on the insulating material layer 1050. In some embodiments, the insulating material layer 1050 may include a heat transfer material. A portion of the heat dissipation member 1065, which is disposed on the first semiconductor chip 1010 and the substrate 1002 that do not overlap the second semiconductor chips 1020, may have a thickness greater than a thickness of the other portion of the heat dissipation member 1065 overlapping the second semiconductor chips 1020. Therefore, in the heat dissipation member 1065, a portion of the heat dissipation member 1065 having a relatively thin thickness may cover or overlap upper portions of the second semiconductor chips 1020.

In some embodiments, in the heat dissipation member 1065, a portion of the heat dissipation member 1065 having a relatively thick thickness may face a side surface of at least a portion of the second semiconductor chips 1020.

Figure 18A:
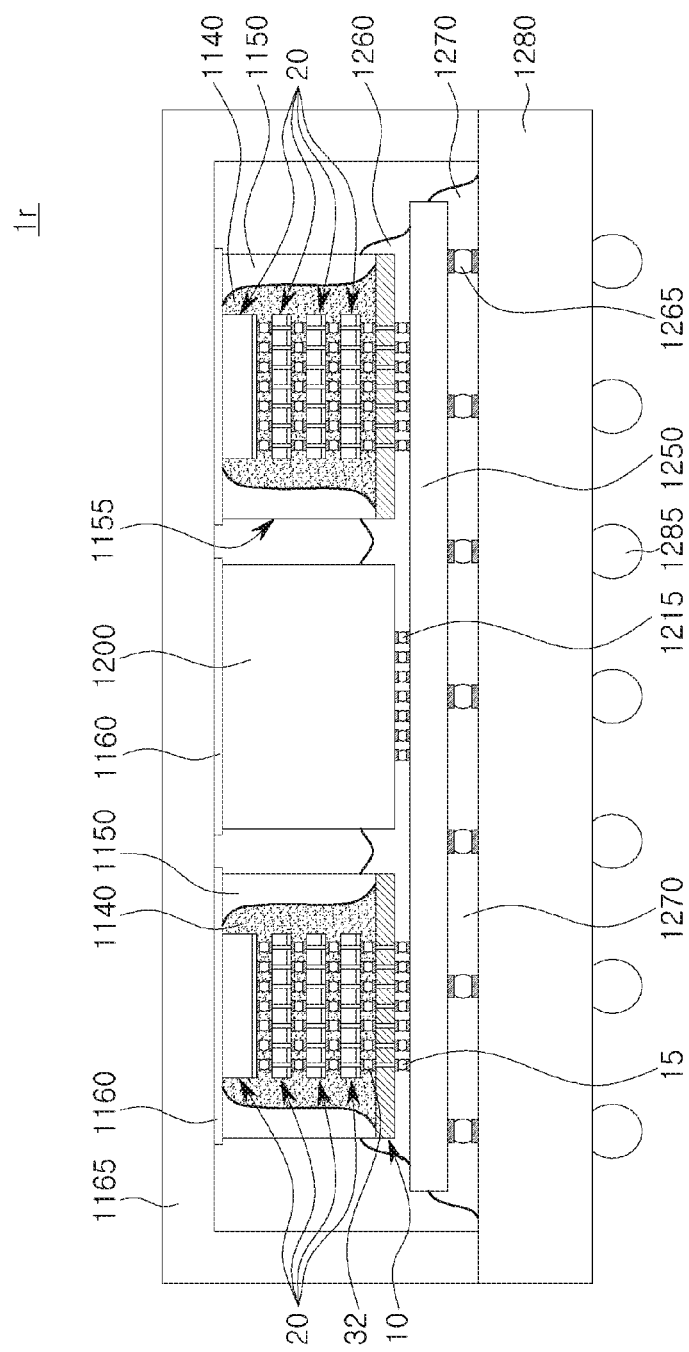
FIGS. 18A and 18B are cross-sectional views illustrating semiconductor packages according to embodiments of the present inventive concept.

Next, a semiconductor package 1*r* according to another embodiment of the present inventive concept will be illustrated in FIG. 18A. FIG. 18A is a cross-sectional view illustrating a semiconductor package 1*r* according to some embodiments of the present inventive concept.

Referring to FIG. 18A, a semiconductor package 1*r* according to some embodiments may include a printed circuit board 1280, a package substrate 1250 disposed on the printed circuit board 1280, connection bumps 1265 disposed between the package substrate 1250 and the printed circuit board 1280 and electrically connecting the package substrate 1250 and the printed circuit board 1280, and solder bumps 1285 disposed on a lower surface of the printed circuit board 1280.

In some embodiments, the package substrate 1250 may be an interposer.

The semiconductor package 1r may further include a substrate 10 disposed on the package substrate 1250, substrate bumps 15 electrically connecting the substrate 10 and the package substrate 1250, a plurality of stacked chips 20 disposed on the substrate 10, chip bumps 32 electrically connecting the plurality of stacked chips 20 and the substrate 10, an underfill material layer 1140, and a mold layer 1150. The chip bumps 32 may include the lower bumps 32a and the interlayer bumps 32b, as illustrated in FIG. 1.

In some embodiments, the substrate 10, the plurality of stacked chips 20, and the chip bumps 32 may be the same as illustrated in FIG. 1.

In some embodiments, the underfill material layer 1140 and the mold layer 1150 may be the same as the underfill material layer (40 of FIG. 1) and the mold layer (50 of FIG. 1) illustrated in FIG. 1.

The substrate 10, the plurality of stacked chips 20, the underfill material layer 1140, the mold layer 1150, and the chip bumps 32 may be referred to as a stacked chip package 1155.

In some embodiments, the substrate 10 may be disposed as a plurality of substrates, and the plurality of stacked chips 20, the underfill material layer 1140, and the mold layer 1150, as described above, may be arranged on each of the plurality of substrates 10. Therefore, the stacked chip package 1155 may be disposed as a plurality of stacked chip packages on the package substrate 1250.

The semiconductor package 1r may further include a semiconductor chip 1200 disposed on the package substrate 1250 to be spaced apart from the substrate 10 and the mold layer 1150, and semiconductor chip bumps 1215 electrically connecting the semiconductor chip 1200 and the package substrate 1250.

In some embodiments, at least a portion of the plurality of stacked chips 20 may be a memory semiconductor chip, and the semiconductor chip 1200 may be a central processing unit (CPU) semiconductor chip or a graphics processing unit (GPU) semiconductor chip.

The semiconductor package 1r may further include a first underfill material layer 1260 surrounding side surfaces of the substrate bumps 15, filling a space between the substrate 10 and the package substrate 1250, surrounding side surfaces of the semiconductor chip bumps 1215, and filling a space between the semiconductor chip 1200 and the package substrate 1250.

In some embodiments, the first underfill material layer 1260 may extend onto a side surface of the substrate 10.

In some embodiments, a portion of the first underfill material layer 1260 filling a space between the substrate 10 and the package substrate 1250 may be connected to a portion of the first underfill material layer 1260 filling a space between the semiconductor chip 1200 and the package substrate 1250.

In some embodiments, a portion of the first underfill material layer 1260 filling a space between the substrate 10 and the package substrate 1250 and a portion of the first underfill material layer 1260 filling a space between the semiconductor chip 1200 and the package substrate 1250 may be modified to be spaced apart from each other.

The semiconductor package 1r may further include a second underfill material layer 1270 disposed on the printed circuit board 1280, surrounding side surfaces of the connection bumps 1265, and filling a space between the printed circuit board 1280 and the package substrate 1250.

The semiconductor package 1r may further include a heat dissipation member 1165 disposed on the printed circuit board 1280, and a heat transfer material layer 1160 below the heat dissipation member 1165.

The heat dissipation member 1165 may cover or overlap the substrate 10, the plurality of stacked chips 20, the semiconductor chip 1200, and the mold layer 1150.

The heat transfer material layer 1160 may include a portion interposed between the plurality of stacked chips 20 and the heat dissipation member 1165, and a portion interposed between the semiconductor chip 1200 and the heat dissipation member 1165. The heat transfer material layer 1160 may further include a portion extending from a portion interposed between the plurality of stacked chips 20 and the heat dissipation member 1165 into a space between the mold layer 1150 and the heat dissipation member 1165.

In some embodiments, the underfill material layer 1140 and the mold layer 1150 may be replaced with the underfill material layer (40a of FIG. 4) and the mold layer (50a of FIG. 4) illustrated in FIG. 4.

In some embodiments, the underfill material layer 1140 and the mold layer 1150 may be replaced with the underfill material layer (140 in FIG. 5) and the mold layer (150 in FIG. 5) illustrated in FIG. 5.

In some embodiments, the underfill material layer 1140 and the mold layer 1150 may be replaced with the underfill material layer (140a of FIG. 6) and the mold layer (150a of FIG. 6) illustrated in FIG. 6.

In some embodiments, the underfill material layer 1140 and the mold layer 1150 may be replaced with the underfill material layer (240 of FIG. 7) and the mold layer (250 of FIG. 7) illustrated in FIG. 7.

In some embodiments, the underfill material layer 1140 and the mold layer 1150 may be replaced with the underfill material layer (340 of FIG. 8) and the mold layer (350 of FIG. 8) illustrated in FIG. 8.

In some embodiments, the underfill material layer 1140 and the mold layer 1150 may be replaced with the underfill material layer (340a of FIG. 9) and the mold layer (350a of FIG. 9) illustrated in FIG. 9.

In some embodiments, the underfill material layer 1140 and the mold layer 1150 may be replaced with the underfill material layer (440 of FIG. 10) and the mold layer (450 of FIG. 10) illustrated in FIG. 10.

In some embodiments, the underfill material layer 1140 and the mold layer 1150 may be replaced with the underfill material layer (440a of FIG. 11) and the mold layer (450a of FIG. 11) illustrated in FIG. 11.

In some embodiments, the first underfill material layer 1260 may be in contact with the side surface of the substrate 10, and may be in contact with a portion of the mold layer 1150.

Figure 18B:
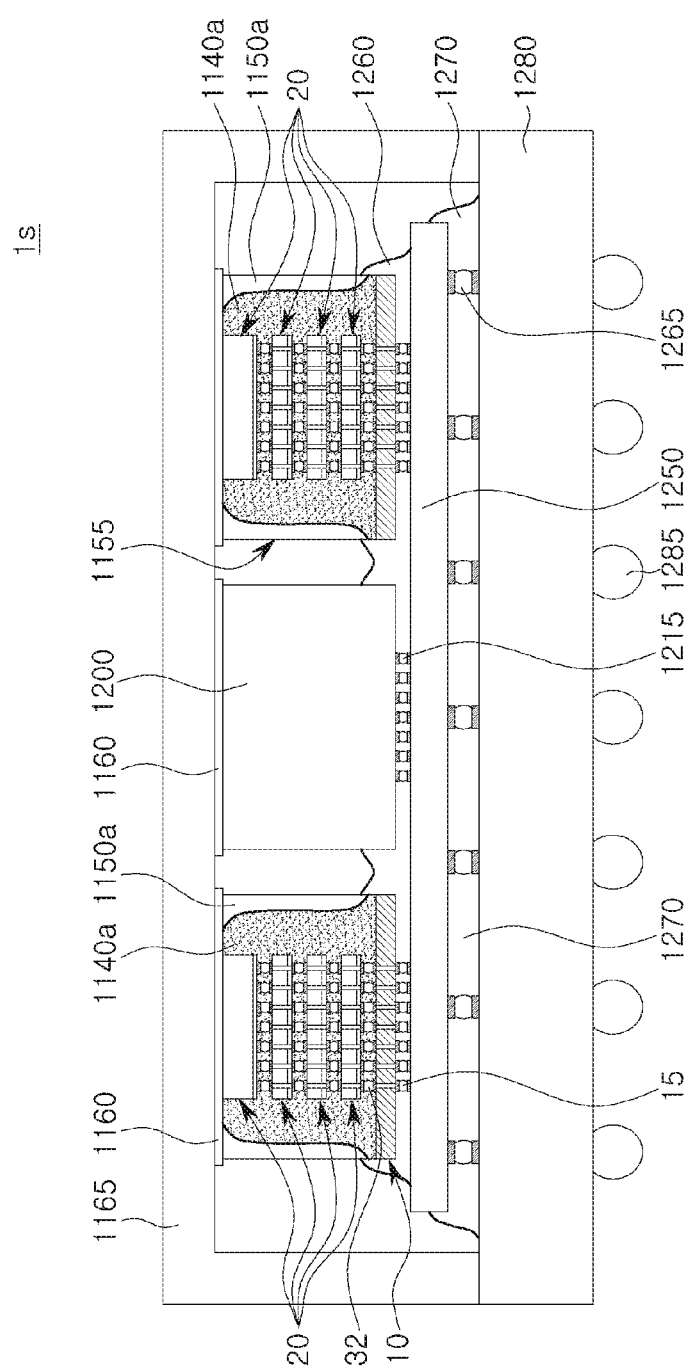

In some embodiments, the first underfill material layer 1260 may be disposed to be spaced apart from the mold layer 1150. The technical concept of the present inventive concept is not limited thereto. The mold layer 1150 may be modified to contact the first underfill material layer 1260. As such, an example in which the mold layer 1150 is modified to contact the first underfill material layer 1260 will be illustrated in FIG. 18B. FIG. 18B is a cross-sectional view illustrating a modified example of a semiconductor package according to another embodiment of the present inventive concept. In the semiconductor package illustrated in FIG. 18B, modified portions of the mold layer (1150 of FIG. 18A)

and the underfill material layer (1140 of FIG. 18A) illustrated in FIG. 18A will be mainly described.

Referring to FIG. 18B, a semiconductor package 1s may include an underfill material layer 1140a modified to contact the first underfill material layer 1260, and a mold layer 1150a disposed to be spaced apart from the substrate 10.

In some embodiments, the first underfill material layer 1260 may be in contact with a portion of the mold layer 1150a.

The underfill material layer 1140a and the mold layer 1150a may be substantially the same as the underfill material layer (740 of FIG. 16) and the mold layer (750 of FIG. 16) illustrated in FIG. 16.

Next, a method of forming a semiconductor package according to some embodiments of the present inventive concept will be illustrated in FIGS. 19A to 23. FIGS. 19A to 23 are diagrams illustrating examples of a method of forming a semiconductor package according to some embodiments of the present inventive concept.

Figure 19A:
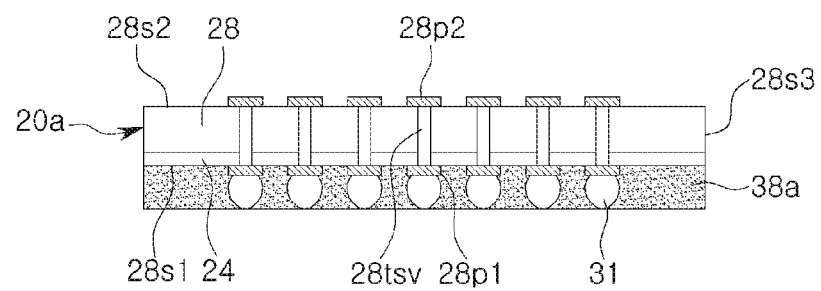
FIGS. 19A, 19B, 19C, and 20 to 23 are diagrams illustrating example embodiments of a method of forming a semiconductor package according to some embodiments of the present inventive concept.

First, referring to FIG. 19A, a first chip 20a to which solder balls 31 are attached, and a first non-conductive film 38a attached to the first chip 20a and surrounding side surfaces of the solder balls 31, may be prepared.

The first chip 20a may be the same as the lower chip 20L and the one or plurality of intermediate chips 20M illustrated in FIG. 1. Therefore, the first chip 20a may include a lower chip base 28 having a first surface 28s1 and a second surface 28s2 opposing each other, first chip pads 28p1 disposed on the first surface 28s1 of the lower chip base 28, second chip pads 28p2 disposed on the second surface 28s2 of the lower chip base 28, and a plurality of through electrode structures 28tsv electrically connecting the first chip pads 28p1 and the second chip pads 28p2, as illustrated in FIG. 1. The lower chip base 28 may include an internal circuit region 24, as illustrated in FIG. 1.

The first surface 28s1 of the lower chip base 28 may be referred to as a first surface of the first chip 20a, and the second surface 28s2 of the lower chip base 28 may be referred to as a second surface of the first chip 20a.

The solder balls 31 may be in contact with the first chip pads 28p1 of the first chip 20a.

The first non-conductive film 38a may be bonded to the first surface 28s1 of the first chip 20a, and may not cover or overlap a side surface 28s3 of the first chip 20a. The internal circuit region 24 may be disposed on the first surface 28s1 of the first chip 20a, and the first non-conductive film 38a may cover or overlap the internal circuit region 24.

In some embodiments, the first non-conductive film 38a may have a viscosity of about 1 to about 100 Pa·s. The first non-conductive film 38a may have a viscosity of about 1 to about 10 Pa·s.

Figure 19B:
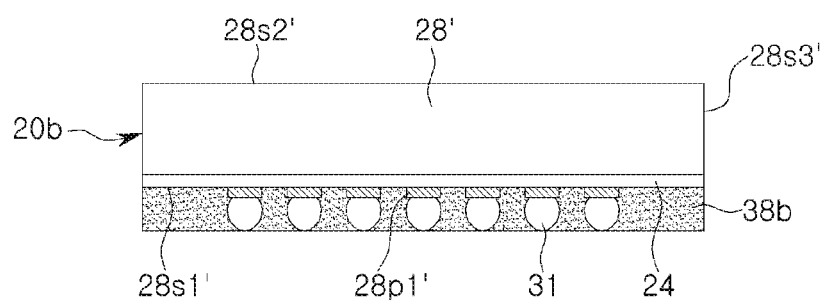

Referring to FIG. 19B, a second chip 20b to which solder balls 31 are attached, and a second non-conductive film 38b attached to the second chip 20b and surrounding side surfaces of the solder balls 31, may be formed. The second chip 20b may be prepared as a plurality of second chips. A thickness of the second chip 20b may be greater than a thickness of the first chip 20a.

The second chip 20b may be the upper chip (20U of FIG. 1) illustrated in FIG. 1. Therefore, like the upper chip (20U of FIG. 1) illustrated in FIG. 1, the second chip 20b include an upper chip base 28' having a first surface 28s1' and a second surface 28s2' opposing each other, lower chip pads 28p1' disposed on the first surface 28s1' of the upper chip base 28', and an internal circuit region 24 formed in the first surface 28s1' of the upper chip base 28'.

The first surface 28s1' of the upper chip base 28' may be referred to as a first surface of the second chip 20b, and the second surface 28s2' of the upper chip base 28' may be referred to as a second surface of the second chip 20b.

The second non-conductive film 38b may be attached to the first surface 28s1' of the second chip 20b, and may not cover or overlap a side surface 28s3' of the second chip 20b. The second non-conductive film 38b may cover or overlap the internal circuit region 24 of the second chip 20b. The second non-conductive film 38b may have a viscosity of about 1 to about 10 Pa·s.

Figure 19C:
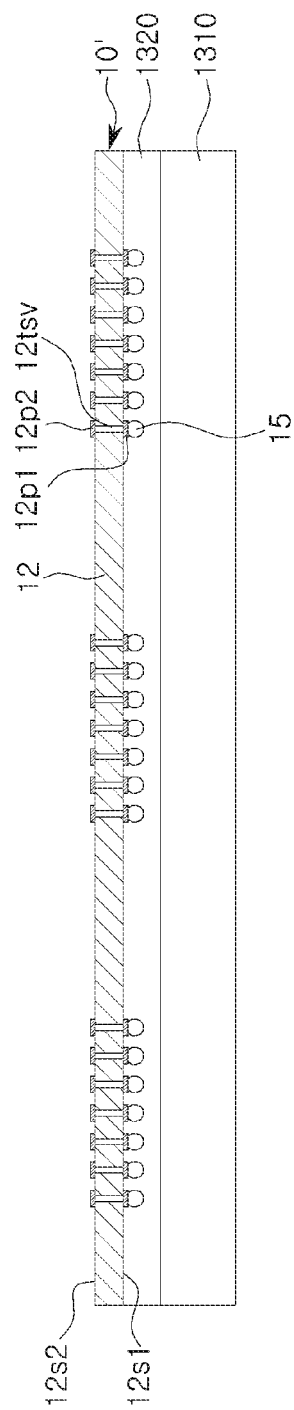

Referring to FIG. 19C, a preliminary substrate 10' may be prepared. The preliminary substrate 10' may include a substrate base 12, first substrate pads 12p1 disposed on a first surface 12s1 of the substrate base 12, second substrate pads 12p2 disposed on a second surface 12s2 of the substrate base 12, and internal electrodes 12tsv formed in the substrate base 12 and electrically connecting the first substrate pads 12p1 and the second substrate pads 12p2.

Substrate bumps 15 may be attached to the first substrate pads 12p1 of the preliminary substrate 10'.

The first surface 12s1 of the preliminary substrate 10' may be attached to a protective film 1320. The first surface 12s1 of the preliminary substrate 10' may be in contact with the protective film 1320, the substrate bumps 15 attached to the first substrate pads 12p1 of the preliminary substrate 10' may enter the protective film 1320. For example, since a thickness of the protective film 1320 is greater than a height of each of the substrate bumps 15, the protective film 1320 may cover or overlap side surfaces and lower surfaces of the substrate bumps 15. Therefore, the preliminary substrate 10' may be fixed on a support 1310 by the protective film 1320.

Figure 20:
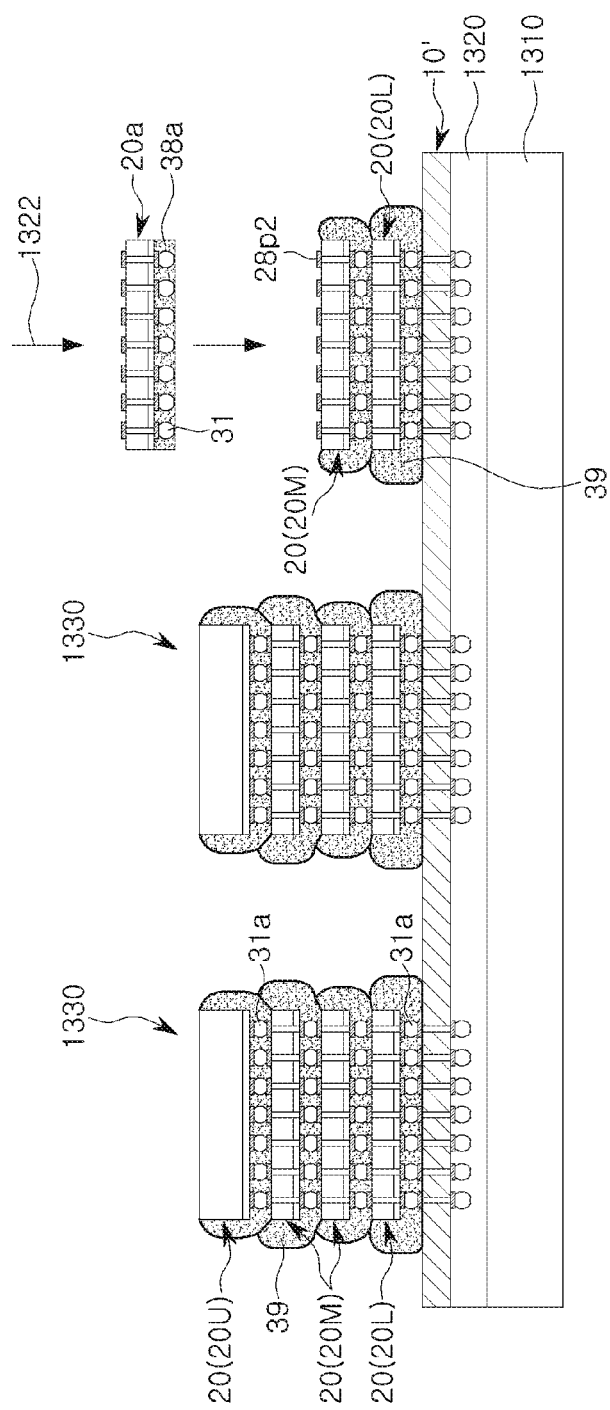

Referring to FIG. 20, the first chip (20a of FIG. 19A) to which the solder balls 31 and the first non-conductive film 38a are attached, prepared in FIG. 19A, may be stacked, in plural, under pressure 1322 on the preliminary substrate 10' fixed to the support 1310 by the protective film 1320, prepared in FIG. 19C, to form a lower chip 20L and one or a plurality of intermediate chips 20M disposed on the lower chip 20L. Thereafter, the second chip (20b of FIG. 19B) to which the solder balls 31 and the second non-conductive film 38b are attached, prepared in FIG. 19B, may be stacked on the one or plurality of intermediate chips 20M under pressure.

For example, the attachment of the first chip (20a of FIG. 19A) to the preliminary substrate 10' may apply pressure to an upper portion of the first chip (20a of FIG. 19A) in a downward direction, and to bond the solder balls 31 and the first non-conductive film 38a, attached to the first chip (20a of FIG. 19A), to the preliminary substrate 10'. Therefore, due to the pressure applied to the upper portion of the first chip (20a of FIG. 19A) in the downward direction, the solder balls (31 of FIG. 19A) may be formed as preliminary chip bumps 31a, with a decrease in thickness thereof, and the non-conductive film 38a may protrude in a direction towards a side surface of the first chip (20a of FIG. 19A) with a decrease in thickness thereof. In some embodiments, the protruding portion of the non-conductive film 38a may protrude beyond the side surface of the first chip 20a.

The first chip (20a of FIG. 19A) attached to the preliminary substrate 10' may be referred to as the lower chip 20L. The solder balls 31 and the first non-conductive film 38a attached to the first chip (20a of FIG. 19A) may be bonded to the lower chip 20L. For example, the pressure 1322 may be applied to the upper portion of the first chip (20a of FIG. 19A), prepared as illustrated in FIG. 19A, on the lower chip 20L, to bond the solder balls 31 and the first non-conductive film 38a to the lower chip 20L. Therefore, due to the pressure 1322 applied to the upper portion of the first chip (20a of FIG. 19A), the solder balls (31 of FIG. 19A) may be formed as the preliminary chip bumps 31a, with a decrease in thickness thereof, and the non-conductive film 38a may protrude forward the side surface of the first chip (20a of FIG. 19A), with a decrease in thickness thereof. As such, the first chip (20a of FIG. 19A) bonded to the lower chip 20L may be referred to as the intermediate chip 20M.

In some embodiments, a process of bonding the first chip (20a of FIG. 19A), prepared as illustrated in FIG. 19A, to the intermediate chip 20M may be repeated one or more times.

The second chip (20b of FIG. 19B), prepared as illustrated in FIG. 19B, may be bonded to the intermediate chip 20M. For example, pressure may be applied to an upper portion of the second chip (20b of FIG. 19B), prepared as illustrated in FIG. 19B, in a downward direction to bond the solder balls 31 and the second non-conductive film 38b attached to the second chip (20b of FIG. 19B) on the intermediate chip 20M. Therefore, due to the pressure applied to the upper portion of the second chip (20b of FIG. 19B), the solder balls (31 of FIG. 19B) may be formed as the preliminary chip bumps 31a, with a decrease in thickness thereof, and the non-conductive film 38b may protrude forward the side surface of the second chip (20b of FIG. 19B), with a decrease in thickness thereof. As such, the second chip (20b of FIG. 19B) bonded to the intermediate chip 20M may be referred to as the upper chip 20U.

Depending on the thickness of the second non-conductive film (38b of FIG. 19B), the second non-conductive film (38b of FIG. 19B) may entirely cover or overlap the side surface of the upper chip 20U, or may partially cover or overlap the side surface of the upper chip 20U.

The lower chip 20L, the one or more intermediate chips 20M, and the upper chip 20U may be referred to as the plurality of stacked chips 20. The first and second non-conductive films (38a of FIG. 19A, and 38b of FIG. 19B) may protrude forward side surfaces of the plurality of stacked chips 20, and may have a preliminary underfill material layer 39 having boundary surfaces 39a.

An operation of bonding the first chip (20a of FIG. 19A) to the preliminary substrate 10', an operation of bonding the first chip (20a of FIG. 19A) to the lower chip 20L, and an operation of bonding the second chip (20b of FIG. 19B) to the intermediate chip 20M may be performed within a solder reflow temperature ranges in which the solder balls 31 are not substantially reflowed, and within temperature ranges lower than a temperature that the first and second non-conductive films (38a of FIG. 19A, and 38b of FIG. 19B) are not substantially reflowed. For example, an operation of bonding the first chip (20a of FIG. 19A) to the preliminary substrate 10', an operation of bonding the first chip (20a of FIG. 19A) to the lower chip 20L, and an operation of bonding the second chip (20b of FIG. 19B) to the intermediate chip 20M may be performed within temperature ranges higher than room temperature and lower than approximately 200° C.

The solder balls 31 of FIGS. 19A and 19B may be formed as the preliminary chip bumps 31a having a relatively reduced thickness.

In some embodiments, the preliminary chip bumps 31a may be formed to have a vertically symmetrical structure.

In some embodiments, the preliminary chip bumps 31a may be formed to have a vertically asymmetric structure, for example, a structure substantially the same as or similar to that of the chip bump (32' of FIG. 3) illustrated in FIG. 3.

On the preliminary substrate 10', the plurality of stacked chips 20, the preliminary chip bumps 31a, and the preliminary underfill material layer 39 may be referred to as a preliminary chip stack structure 1330.

The preliminary chip stack structure 1330 may be formed as plurality of chip stack structures on the preliminary substrate 10'.

Figure 21:
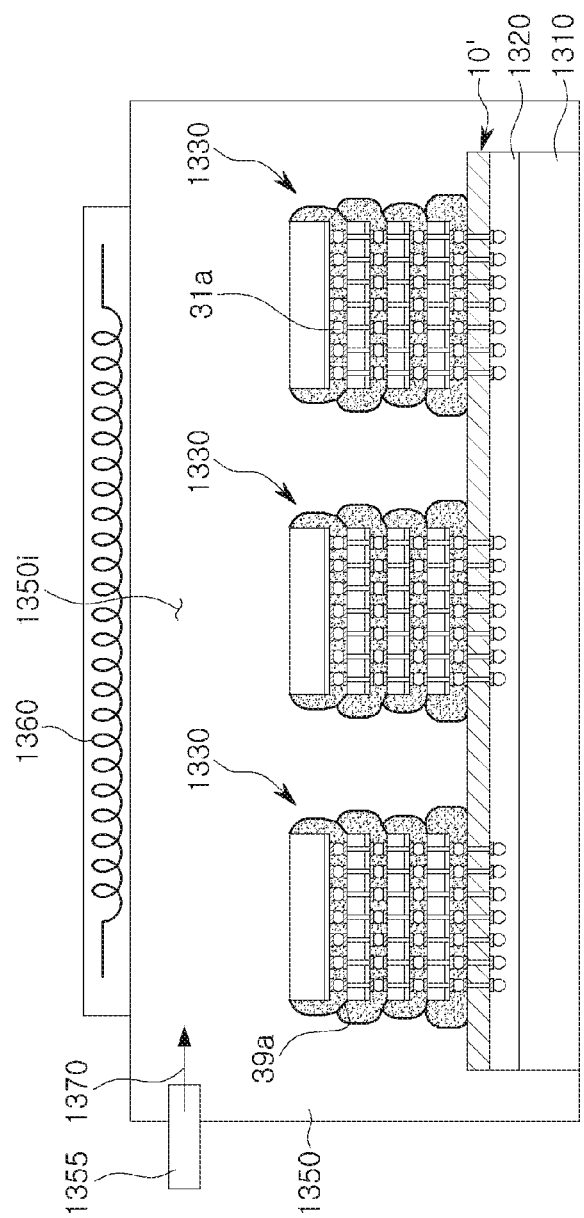

Referring to FIG. 21, the plurality of preliminary chip stack structures 1330 formed on the preliminary substrate 10' may be loaded into a process chamber 1350.

The process chamber 1350 may include a gas supply unit 1355 capable of supplying an inert gas 1370 to an internal space 1350i of the process chamber 1350, and a heater unit 1360 capable of applying heat to the plurality of preliminary chip stack structures 1330 formed on the preliminary substrate 10'. The heater unit 1360 may be located on the plurality of preliminary chip stack structures 1330 formed on the preliminary substrate 10'. The heater unit 1360 may include a lamp capable of generating heat.

Figure 22:
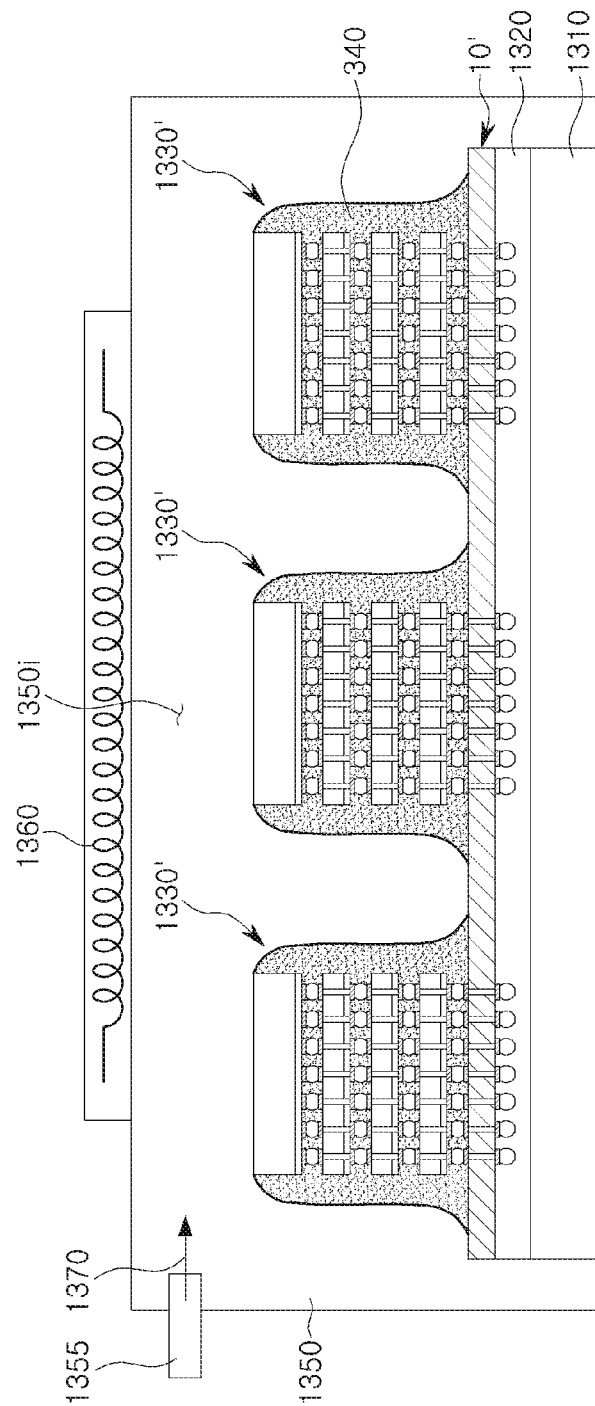

Referring to FIG. 22, a solder reflow process and an underfill material reflow process may be performed under a pressurized atmosphere using the inert gas 1370 and under a high temperature atmosphere using the heater unit 1360 in the process chamber 1350.

In some embodiments, the solder reflow process and the underfill material reflow process may proceed within pressure ranges higher than 1 atmosphere and lower than about 50 atmospheres. The solder reflow process and the underfill material reflow process may be performed within pressure ranges of about 7 atmospheres to about 30 atmospheres.

In some embodiments, the solder reflow process and the underfill material reflow process may proceed within temperature ranges of about 200° C. to about 350° C. The solder reflow process and the underfill material reflow process may proceed within temperature ranges of about 250° C. to about 300° C.

Due to the solder reflow process and the underfill material reflow process, the preliminary chip bumps 31a of each of the plurality of preliminary chip stack structures 1330 may be reflowed to form chip bumps 32. The preliminary underfill material layer 39 of each of the preliminary chip stack structures 1330 may be reflowed to form an underfill material layer 340.

In some embodiments, the underfill material layer 340 may have a shape as illustrated in FIG. 8. The underfill material layer 340 may be modified to have various shapes, depending on a thickness of the first and second non-conductive films (38a of FIG. 19A and 38b of FIG. 19B), and temperatures and pressures of the solder reflow process and the underfill material reflow process. For example, the underfill material layer 340 may be formed to have the same shape as an underfill material layer as illustrated in FIG. 4 (e.g., 40a of FIG. 4), an underfill material layer as illustrated in FIG. 5 (e.g., 140 of FIG. 5), an underfill material layer as illustrated in FIG. 6 (e.g., 140a of FIG. 6), an underfill material layer as illustrated in FIG. 7 (e.g., 240 of FIG. 7), or an underfill material layer as illustrated in FIG. 10 (e.g., 440 of FIG. 10).

Due to the solder reflow process and the underfill material reflow process, a decrease in thickness occurred when the preliminary chip bumps 31a are reflowed to form the chip bumps 32 may be smaller than a decrease in thickness occurred when the solder balls (31 of FIG. 19A) are formed as the preliminary chip bumps 31a, due to the pressure applied to the upper portion of the first chip (20a of FIG. 19A) illustrated in FIG. 20.

Due to the solder reflow process and the underfill material reflow process, the plurality of preliminary chip stack structures 1330 may be formed as a plurality of chip stack structures 1330' including the underfill material layer 340 and the chip bumps 32. Therefore, the plurality of chip stack structures 1330' may be formed on the preliminary substrate 10'.

Since the solder reflow process and the underfill material reflow process are performed in a pressurized atmosphere using the inert gas 1370 in the process chamber 1350, problems such as warpage or the like of the plurality of chip stack structures 1330' in the chip stack structures 1330' that may be caused by a high temperature atmosphere of the solder reflow process and the underfill material reflow process when the plurality of preliminary chip stack structures 1330 are formed as the plurality of chip stack structures 1330', may be prevented.

Figure 23:
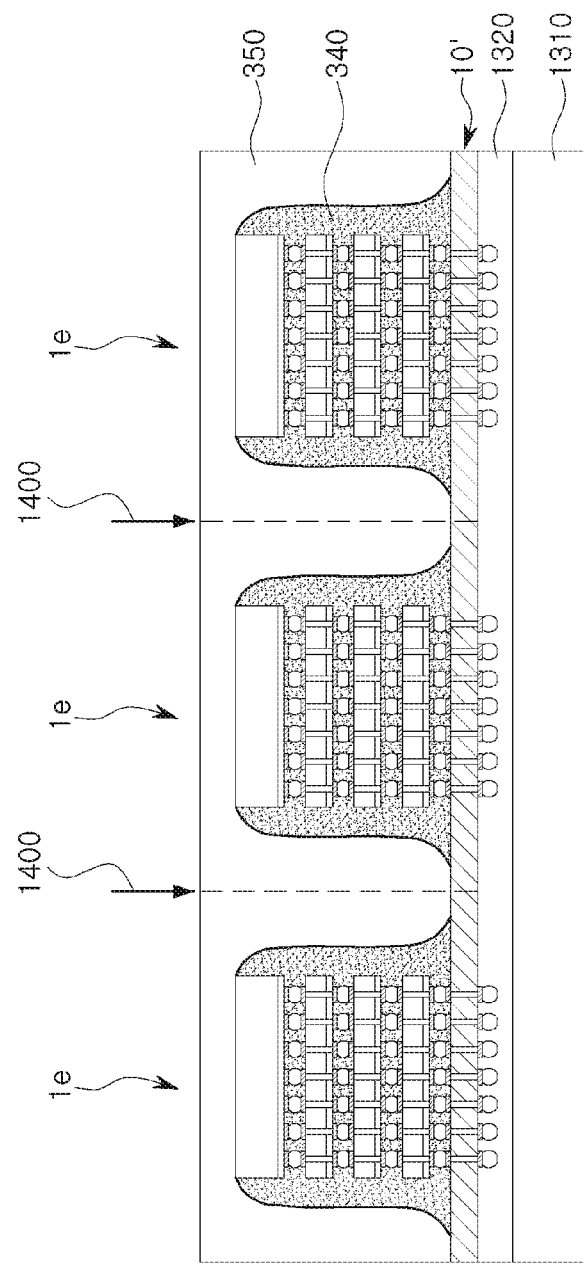

Referring to FIG. 23, the support 1310 to which the preliminary substrate 10' on which the plurality of chip stack structures 1330' are formed is attached may be unloaded from the process chamber (1350 of FIG. 22).

Next, a mold layer 350 may be formed on the preliminary substrate 10' to cover or overlap the plurality of chip stack structures 1330'.

Subsequently, a preliminary cutting process 1400 may be performed to cut the mold layer 350 located between the plurality of chip stack structures 1330' and cut the preliminary substrate 10', to form a semiconductor package 1e.

In some embodiments, before cutting the mold layer 350, the process may further include grinding the mold layer 350 until an upper surface of the upper chip of the plurality of chip stack structures 1330' is exposed. Therefore, the mold layer 350 may be formed as a mold layer (e.g., 50 of FIG. 1) as illustrated in FIG. 1.

As described above, since the cutting process 1400 may be performed after forming the chip stack structures 1330' on the preliminary substrate 10' by using the solder reflow process and the underfill material reflow process, mass production of the semiconductor package may be accomplished. Therefore, productivity of a semiconductor package may be improved.

According to embodiments of the present inventive concept, an underfill material layer formed without any boundary may be formed to cover or overlap side surfaces of a plurality of stacked chips. Therefore, since the plurality of stacked chips in a semiconductor package may be protected by the underfill material layer and the mold layer, it is possible to provide a semiconductor package having relatively high reliability.

According to embodiments of the present inventive concept, a method for improving the productivity of the semiconductor package may be provided.

While embodiments have been illustrated and described above, it will be apparent to those skilled in the art that modifications and variations could be made without departing from the scope of the present inventive concept as defined by the appended claims.

What is claimed is:

1. A semiconductor package comprising:
a plurality of stacked chips on a substrate and spaced apart from each other in a vertical direction, the plurality of stacked chips including a lower chip and an upper chip, wherein the vertical direction is a direction substantially perpendicular to an upper surface of the substrate;
lower bumps between the lower chip and the substrate;
interlayer bumps between adjacent chips among the plurality of stacked chips;
a mold layer on the substrate; and
an underfill material layer on the substrate,
wherein the underfill material layer comprises a lower portion, an interlayer portion, and a side portion,
wherein the lower portion of the underfill material layer is on a side surface of each of the lower bumps and is in a space between the lower chip and the substrate,
wherein the interlayer portion is on a side surface of each of the interlayer bumps and is in a space between adjacent chips among the plurality of stacked chips,
wherein the side portion extends from the lower portion and the interlayer portion and is adjacent to side surfaces of the plurality of stacked chips,
wherein the side portion of the underfill material layer comprises a first side portion, a second side portion on the first side portion, and a third side portion on the second side portion,
wherein a slope of the second side portion is steeper than a slope of the first side portion,
wherein the slope of the second side portion is steeper than a slope of the third side portion,
wherein the first side portion continuously extends from the upper surface of the substrate toward a lower end of the second side portion,
wherein the second side portion overlaps at least two chips adjacent to each other, among the plurality of stacked chips, in a horizontal direction,
wherein the horizontal direction is substantially parallel to the upper surface of the substrate, and
wherein at least a portion of the mold layer is on the side portion of the underfill material layer.

2. The semiconductor package according to claim 1, wherein the side portion of the underfill material layer further comprises a lower curved portion between the first side portion and the second side portion.

3. The semiconductor package according to claim 1, wherein the side portion of the underfill material layer further comprises an upper curved portion between the second side portion and the third side portion.

4. The semiconductor package according to claim 1, further comprising:
a heat transfer material layer; and
a heat dissipation member on the heat transfer material layer,
wherein the heat dissipation member contacts the heat transfer material layer, and
wherein the heat transfer material layer is in contact with the upper chip and the mold layer.

5. The semiconductor package according to claim 4, wherein an upper end of the side portion of the underfill material layer is in contact with the heat transfer material layer.

6. The semiconductor package according to claim 5,
wherein a thickness of the upper chip of the plurality of stacked chips is greater than a thickness of remaining ones of the plurality of stacked chips,
wherein the side portion of the underfill material layer is in contact with a portion of a side surface of the upper chip, and
wherein the mold layer is in contact with a remaining portion of the side surface of the upper chip.

7. The semiconductor package according to claim 1,
wherein the side portion of the underfill material layer further comprises a third side portion on the second side portion, and
wherein the third side portion is inclined with respect to the vertical direction, wherein the third side portion is spaced apart from the upper surface of the substrate, and wherein the third side portion is spaced apart from the upper chip.

8. The semiconductor package according to claim 1, wherein the plurality of stacked chips further comprise one or a plurality of intermediate chips between the upper chip and the lower chip, wherein each of the one or the plurality of intermediate chips, the upper chip and the lower chip comprises a lower chip base having a first surface and a second surface opposing each other, first chip pads on the first surface, second chip pads on the second surface, and through electrode structures electrically connecting the first chip pads and the second chip pads, and wherein the upper chip comprises an upper chip base and upper chip pads on upper chip pads.

9. The semiconductor package according to claim 8, wherein each of the upper chip base and the lower chip base comprises an internal circuit region, and wherein the underfill material layer is on a side of the internal circuit region of the upper chip base and a side of the internal circuit region of the lower chip base.

10. The semiconductor package according to claim 1, wherein the mold layer is spaced apart from the substrate, and wherein the underfill material layer extends between the mold layer and the substrate.

11. The semiconductor package according to claim 1, wherein at least one of the lower bumps and the interlayer bumps comprises a lower portion and an upper portion of an asymmetrical structure.

12. The semiconductor package according to claim 1, wherein the underfill material layer comprises a first filler, wherein the mold layer comprises a second filler, and wherein a diameter of the second filler is greater than a diameter of the first filler.

13. The semiconductor package according to claim 1, further comprising:

a printed circuit board;

a package substrate on the printed circuit board;

a semiconductor chip on the package substrate;

one or a plurality of stacked chip packages on the package substrate;

a heat dissipation member on the printed circuit board and overlapping the semiconductor chip and the one or plurality of stacked chip packages; and a heat transfer material layer that is between the heat dissipation member and the semiconductor chip, and is between the heat dissipation member and the one or plurality of stacked chip packages, wherein each of the one or plurality of stacked chip packages comprises the substrate, the plurality of stacked chips, the lower bumps, the interlayer bumps, the mold layer, and the underfill material layer, wherein at least a portion of the plurality of stacked chips comprises a memory semiconductor chip, and wherein the semiconductor chip is a central processing unit (CPU) semiconductor chip or a graphics processing unit (GPU) semiconductor chip.

14. The semiconductor package according to claim 13, further comprising:

a first underfill material layer between the package substrate and the substrate and extending onto a side surface of the substrate in the one or plurality of stacked chip packages, wherein the first underfill material layer is spaced apart from the underfill material layer of the one or plurality of stacked chip packages.

15. The semiconductor package according to claim 13, further comprising:

a first underfill material layer between the package substrate and the substrate, wherein the first underfill material layer extends onto a side surface of the substrate in the one or plurality of stacked chip packages, and wherein the first underfill material layer contacts the underfill material layer of the one or plurality of stacked chip packages.

16. A semiconductor package comprising:

one or a plurality of chips on a substrate;

bumps below each of the one or plurality of chips; and an underfill material layer on the substrate, on a side surface of each of the bumps, and extending onto a side surface of each of the one or plurality of chips, wherein the underfill material layer comprises a first side portion, a second side portion on the first side portion, a third side portion on the second side portion, a lower curved portion between the first side portion and the second side portion, and an upper curved portion between the second side portion and the third side portion, wherein a slope of the second side portion is steeper than a slope of the first side portion, and wherein a slope of the third side portion is less steep than the slope of the second side portion.

17. The semiconductor package according to claim 16, further comprising:

a mold layer on the substrate and contacting the underfill material layer;

a heat transfer material layer contacting the one or plurality of chips, an upper surface of the mold layer, and an upper surface of the underfill material layer; and a heat dissipation member on the heat transfer material layer.

18. A semiconductor package comprising:

a plurality of chips stacked on a substrate in a direction perpendicular to an upper surface of the substrate;

bumps below ones of the plurality of chips; and an underfill material layer on the substrate, on a side surface of each of the bumps, and extending onto a side surface of each of the plurality of chips, wherein the underfill material layer is integrally formed without an interface, wherein the underfill material layer comprises a first portion having a constant slope or a constantly varying slope, a second portion extends from a lower end of the first portion, and a third portion extends from an upper portion of the first portion, wherein at least two chips adjacent to each other, among the plurality of chips, overlap the first portion of the underfill material layer having a constant slope or a constantly varying slope in a horizontal direction, wherein the horizontal direction is parallel to the upper surface of the substrate, wherein a slope of the first portion is steeper than each of slopes of the second portion and the third portion, and wherein the slope of the second portion is steeper than a slope of the third portion.

* * * * *